US011460428B2

(12) United States Patent
Nakane

(10) Patent No.: US 11,460,428 B2
(45) Date of Patent: Oct. 4, 2022

(54) HUMIDITY DETECTING DEVICE AND METHOD OF DETERMINING MALFUNCTION

(71) Applicant: MINEBEA MITSUMI Inc., Nagano (JP)

(72) Inventor: Taketomo Nakane, Tokyo (JP)

(73) Assignee: MINEBEA MITSUMI Inc., Nagano (JP)

( * ) Notice: Subject to any disclaimer, the term of this patent is extended or adjusted under 35 U.S.C. 154(b) by 584 days.

(21) Appl. No.: 16/536,782

(22) Filed: Aug. 9, 2019

(65) Prior Publication Data

US 2020/0158672 A1    May 21, 2020

(30) Foreign Application Priority Data

Nov. 16, 2018 (JP) .............................. JP2018-215850
Nov. 16, 2018 (JP) .............................. JP2018-215852

(51) Int. Cl.
| | |
|---|---|
| *G01N 27/22* | (2006.01) |
| *H01L 29/36* | (2006.01) |
| *G01K 7/16* | (2006.01) |
| *G01K 7/01* | (2006.01) |

(52) U.S. Cl.
CPC .............. *G01N 27/223* (2013.01); *G01K 7/01* (2013.01); *G01K 7/16* (2013.01); *H01L 29/36* (2013.01)

(58) Field of Classification Search
CPC .. G01N 27/121; G01N 27/223; G01N 27/226; G01N 27/046; G01N 27/225; G01N 27/227; G01N 27/228; G01N 27/30; G01N 27/122; G01N 33/0029; G01K 13/00; G01K 7/01; G01K 7/16; H01L 29/36; H01L 29/0821; H01L 29/7302; H01L 23/345;

(Continued)

(56) References Cited

U.S. PATENT DOCUMENTS 4,277,742 A *   7/1981 Kovac ................... G01K 13/00
                                                        219/209
5,149,199 A     9/1992 Kinoshita et al.
7,176,700 B2    2/2007 Itakura et al.
(Continued)

FOREIGN PATENT DOCUMENTS

EP    3062097 A1 *  8/2016 ........... G01N 27/121
JP    S60-24440      2/1985
(Continued)

OTHER PUBLICATIONS

Office Action dated Aug. 2, 2022 with respect to the corresponding Japanese patent application No. 2018-215852.

*Primary Examiner* — Lee E Rodak
(74) *Attorney, Agent, or Firm* — IPUSA, PLLC

(57) ABSTRACT

A humidity detecting device includes a semiconductor substrate including at least one impurity diffusion layer, a heating unit formed by the at least one impurity diffusion layer, and a humidity detecting unit. The humidity detecting unit includes a plurality of insulating films laminated on the semiconductor substrate, a lower electrode disposed over the heating unit via a first insulating film among the insulating films, a humidity sensitive film disposed on a second insulating film among the insulating films, so as to cover the lower electrode, and an upper electrode disposed on the humidity sensitive film.

20 Claims, 21 Drawing Sheets

(58) Field of Classification Search
CPC ............. H01L 29/8605; H01L 27/0248; H01L 29/861

See application file for complete search history.

(56) References Cited

U.S. PATENT DOCUMENTS

| | | | | |
|---|---|---|---|---|
| 2009/0108852 A1* | 4/2009 | Alimi | ................... | G01N 27/223 |
| | | | | 438/49 |
| 2017/0315104 A1 | 11/2017 | Kono | | |
| 2018/0276914 A1* | 9/2018 | Villemin | .............. | G01K 15/007 |

FOREIGN PATENT DOCUMENTS

| | | |
|---|---|---|
| JP | H04-30609 | 2/1992 |
| JP | H06-56742 U | 8/1994 |
| JP | 2003-098012 | 4/2003 |
| JP | 2006-234576 | 9/2006 |
| JP | 2008-039508 | 2/2008 |
| JP | 2017-201293 | 11/2017 |
| JP | 2018-59716 | 4/2018 |

\* cited by examiner

HUMIDITY DETECTING DEVICE AND METHOD OF DETERMINING MALFUNCTION

CROSS-REFERENCE TO RELATED APPLICATION

This application is based upon and claims priority under 35 U.S.C. § 119 to Japanese Patent Application Nos. 2018-215850, filed on Nov. 16, 2018, and 2018-215852, filed on Nov. 16, 2018, the entire contents of which are incorporated herein by reference.

BACKGROUND OF THE INVENTION

1. Field of the Invention

The present disclosure relates to a humidity detecting device and a method of determining malfunction.

2. Description of the Related Art

Some humidity detecting devices are capacitance types in which a moisture sensitive film is used as a dielectric substance, the moisture sensitive film being formed of a high polymer material of which a permittivity changes according to an amount of absorbed water. With respect to such a capacitance type humidity detecting device, a humidity sensitive film is disposed between electrodes, and humidity (relative humidity) is obtained by measuring capacitance possessed between the electrodes.

As an electrode structure of a capacitance type humidity detecting device, a comb-shaped type or a parallel-plate type is known. The comb-shaped type is known as a structure in which a pair of opposite comb-shaped electrodes is provided on a same plane and a humidity sensitive film is provided on the pair of comb-shaped electrodes. The parallel-plate type is known as a structure in which a humidity sensitive film is provided between a lower electrode on a substrate and an upper electrode disposed opposite the lower electrode.

Further, in order to adjust an amount of water of a humidity sensitive film by heating, a capacitance type humidity detecting device is known to have a heating unit (e.g., Japanese Unexamined Patent Application Publication No. 2006-234576 which is hereafter referred to as Patent Document 1). In Patent Document 1, an interconnect layer formed of polysilicon or the like is used as a heat element, and the heating unit is formed on a substrate.

SUMMARY OF THE INVENTION

The present disclosure provides a humidity detecting device including a semiconductor substrate including at least one impurity diffusion layer, a heating unit formed by the at least one impurity diffusion layer, and a humidity detecting unit. The humidity detecting unit includes a plurality of insulating films laminated on the semiconductor substrate, a lower electrode disposed over the heating unit via a first insulating film among the insulating films, a humidity sensitive film disposed on a second insulating film among the insulating films, so as to cover the lower electrode, and an upper electrode disposed on the humidity sensitive film.

BRIEF DESCRIPTION OF THE DRAWINGS

Other objects and further features of embodiments will become apparent from the following detailed description when read in conjunction with the accompanying drawings, in which.

DESCRIPTION OF THE PREFERRED EMBODIMENTS

Figure 1:
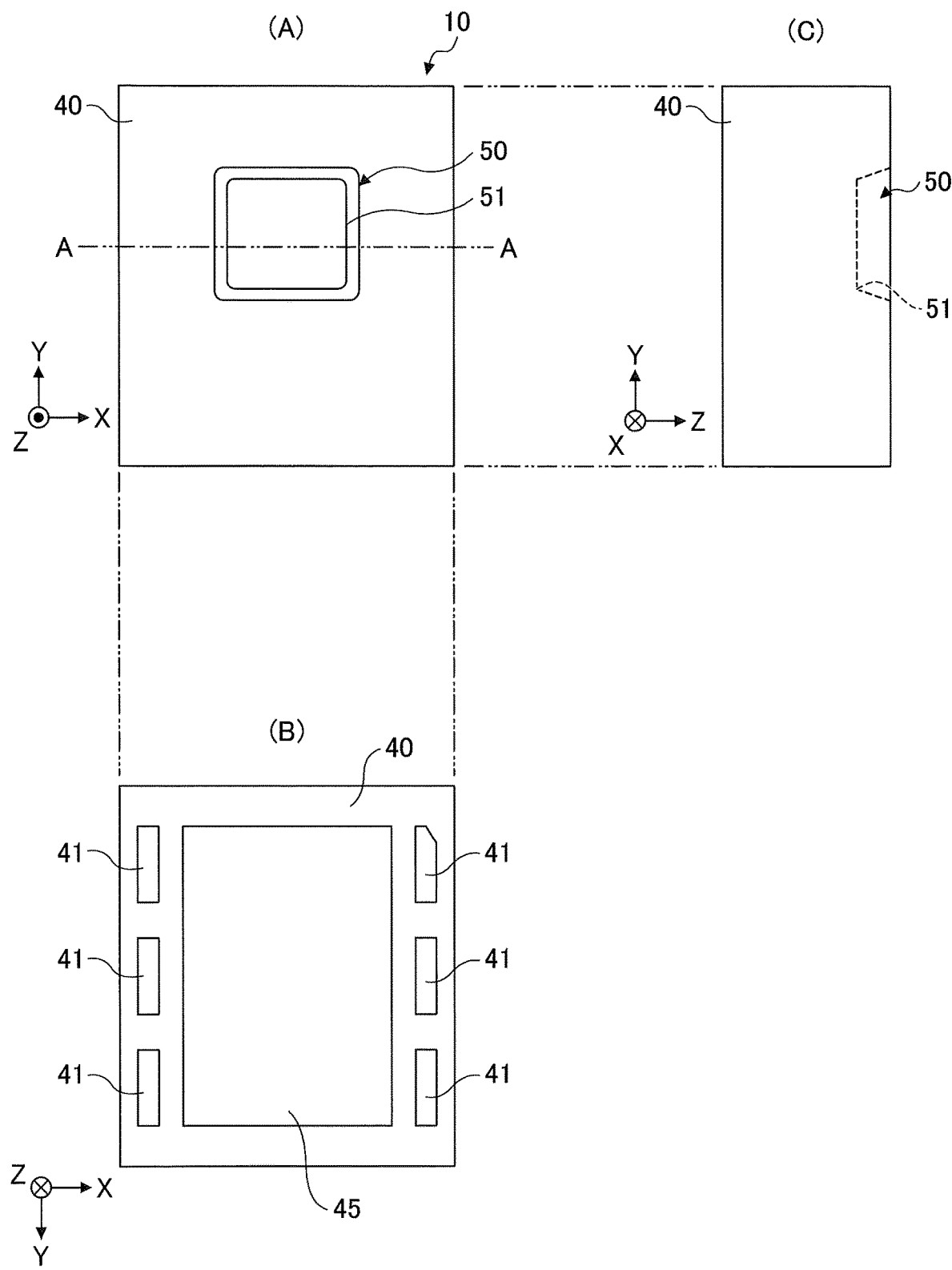
FIG. 1 is a diagram schematically illustrating an example of a configuration of a humidity detecting device according to one embodiment.

With respect to humidity detecting devices known to the inventor, the inventor has recognized that, in a case of an electrode structure of the parallel-plate type, when a heating unit is formed on a substrate as disclosed in Patent Document 1, flatness of electrodes that are laminated over a heating unit via an insulating film may be decreased due to the shape of the heating unit. For example, when a heating unit is shaped in a bellows pattern as disclosed in Patent Document 1, the electrodes may have an uneven shape.

As described above, flatness of electrodes is decreased, and thus a distance between the electrodes may become uneven. Accordingly, variation of capacitance, etc. in manufacturing may be increased, as well as accuracy of humidity detection being decreased.

In light of the points recognized by the inventor, one or more embodiments improve flatness with respect to parallel-plate type electrodes that are disposed over a heating unit.

With reference to the drawings, explanation will be provided hereafter for one or more embodiments. In each figure, the same reference numerals are used to denote same elements; accordingly, for the elements described once, the explanation may be omitted. Note that in the present disclosure, humidity when simply referred to as humidity means relative humidity.

[Outline Configuration]

A configuration of a humidity detecting device 10 according to one embodiment will be described.

Figure 2:
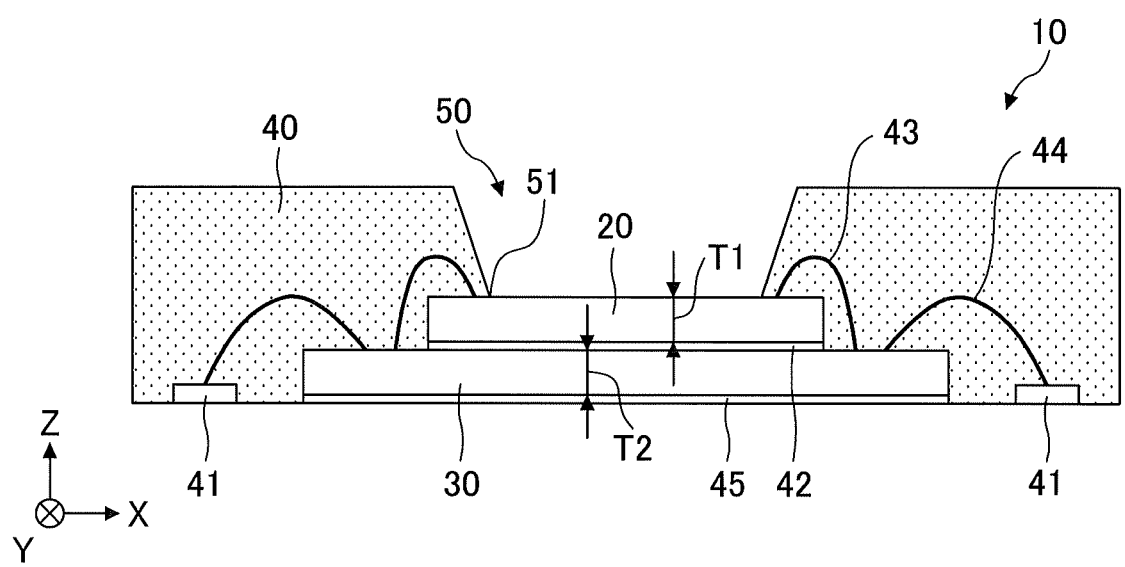
FIG. 2 is a schematic cross-sectional view taken along the A-A line in FIG. 1.

FIG. 1 is a diagram illustrating an example of a schematic configuration of a humidity detecting device 10 according to one embodiment. FIG. 1 (A) is a plan view of the humidity detecting device 10 when viewed from an upper surface thereof. FIG. 1 (B) is a bottom view of the humidity detecting device 10 when viewed from a lower surface thereof. FIG. 1 (C) is a side view of the humidity detecting device 10 when viewed from a lateral direction. FIG. 2 is a schematic cross-sectional view taken along the A-A line in FIG. 1 (A).

The humidity detecting device 10 has an approximately rectangular shape in which one of two opposite pairs of sides is parallel to an X direction and another is parallel to a Y direction. The X and Y directions are orthogonal to each other. The humidity detecting device 10 has a thickness in a Z direction perpendicular to the X direction and the Y direction. Note that the planar shape of the humidity detecting device 10 is not limited to a rectangle, and may be a circle, an ellipse, a polygon, or the like.

The humidity detecting device 10 includes a sensor chip 20 as a first semiconductor chip, an ASIC (Application Specific Integrated Circuit) chip 30 as a second semiconductor chip, mold resin 40, and a plurality of lead terminals 41.

The sensor chip 20 is disposed on the ASIC chip 30 via a first DAF (Die Attach Film) 42. In such a manner, the sensor chip 20 and the ASIC chip 30 are stacked.

The sensor chip 20 and the ASIC chip 30 are electrically connected to each other by a plurality of first bonding wires 43. The ASIC chip 30 and the plurality of lead terminals 41 are electrically connected to each other by a plurality of second bonding wires 44.

The stacked sensor chip 20 and ASIC chip 30, the plurality of first bonding wires 43, the plurality of second bonding wires 44, and the plurality of lead terminals 41 are sealed with the mold resin 40 to form a package. Such a packaging manner is also referred to as a PLP (Plating Lead Package) manner.

As described in more detail below, on a lower surface of the ASIC chip 30, a second DAF 45 used when packaged in the PLP manner remains. The second DAF 45 serves to insulate the lower surface of the ASIC chip 30. The second DAF 45 and the plurality of lead terminals 41 are exposed on a lower surface of the humidity detecting device 10.

Each lead terminal 41 is formed of nickel or copper. Each of the first DAF 42 and the second DAF 45 is formed of an insulating material made of a mixture of resin and silica or the like. The mold resin 40 is black resin capable of shielding light, such as epoxy resin containing mixtures of carbon black, silica, and the like.

An opening 50 is formed on an upper surface of the humidity detecting device 10 to expose a portion of the sensor chip 20 from the mold resin 40. For example, a wall portion forming the opening 50 is tapered, and an opening area of the opening 50 becomes smaller toward the bottom. With respect to the opening 50, a lowest opening that actually exposes the sensor chip 20 is referred to as an effective opening 51.

In forming the opening 50, the sensor chip 20 is sealed with the mold resin 40 while a mold is pressed into the sensor chip 20. In this case, with respect to each of the sensor chip 20 and the ASIC chip 30, due to a force of being pushed by the mold, breakage such as a crack in a chip may occur. To prevent such breakage, each of a thickness T1 of the sensor chip 20 and a thickness T2 of the ASIC chip 30 is preferably 200 μm or more.

Figure 3:
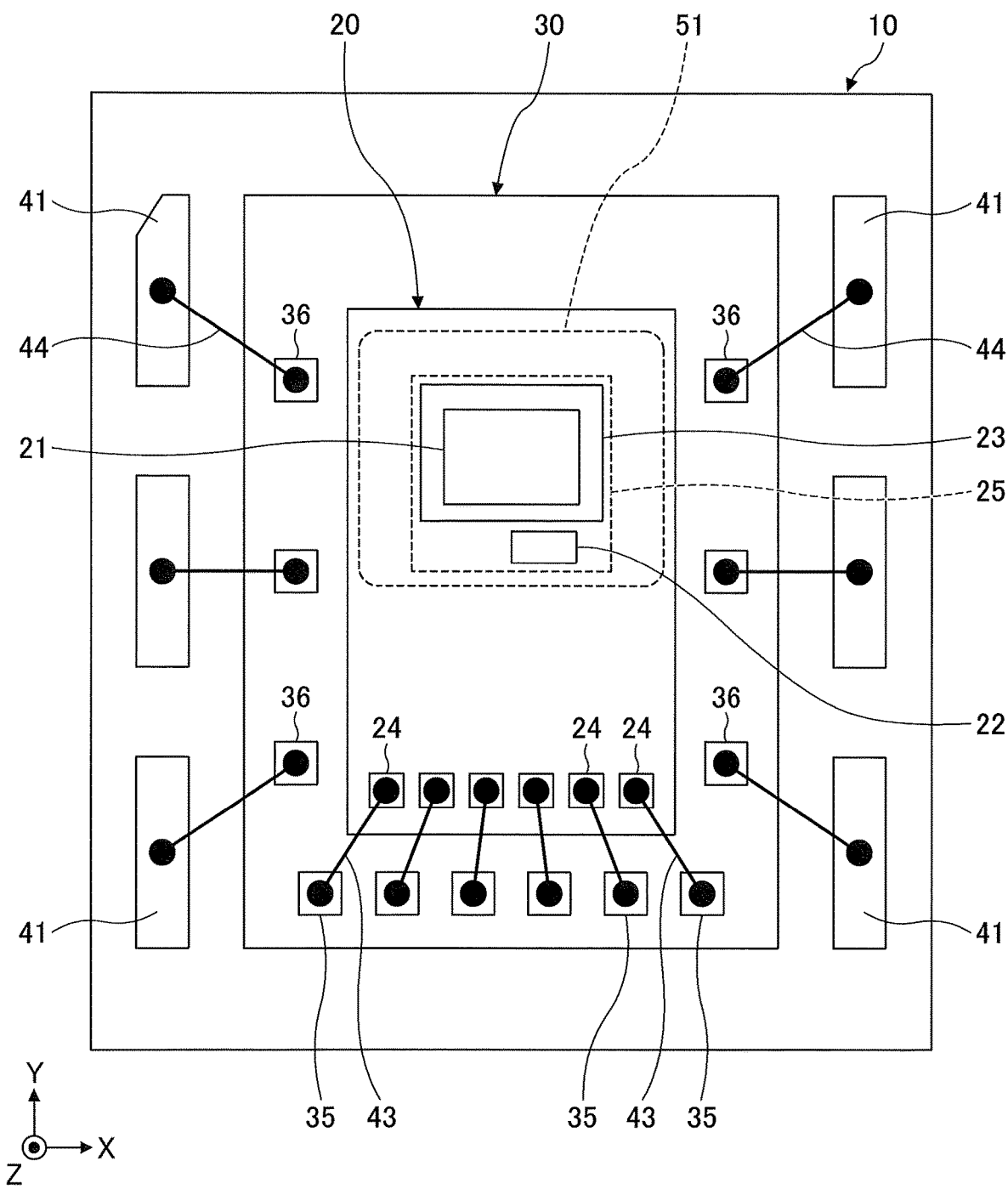
FIG. 3 is a plan view illustrating an example of the humidity detecting device from which mold resin is removed.

FIG. 3 is a plan view illustrating an example of the humidity detecting device 10 from which the mold resin 40 is removed. As illustrated in FIG. 3, with respect to each of the sensor chip 20 and the ASIC chip 30, the planar shape is an approximate rectangle that has two sides parallel to the X direction and two sides parallel to the Y direction. The sensor chip 20 is smaller than the ASIC chip 30, and is disposed on a surface of the ASIC chip 30 via the first DAF 42.

With respect to the sensor chip 20, a humidity detecting unit 21, a temperature detecting unit 22, and a heating unit 23 are provided in an area exposed by the effective opening 51. The heating unit 23 is formed on the underside of the humidity detecting unit 21, so as to cover a region where the humidity detecting unit 21 is formed. In other words, an area of the heating unit 23 is larger than the humidity detecting unit 21. In such a manner, the mold resin 40 used as a sealing member seals the sensor chip 20 or the like in a manner such that the humidity detecting unit 21 and the temperature detecting unit 22 are exposed.

A plurality of bonding pads (which are hereafter simply referred to as pads) 24 are formed in an end portion of the sensor chip 20. In the present embodiment, six pads 24 are formed. The pads 24 are formed of aluminum or an aluminum-silicon alloy (AlSi), for example.

The ASIC chip 30 is a semiconductor chip for signal processing and control. On the ASIC chip 30, a humidity-measurement processing unit 31, a temperature-measurement processing unit 32, a heating control unit 33, and a malfunction determining unit 34 are formed, as described below (see FIG. 12).

On a surface of the ASIC chip 30, a plurality of first pads 35 and a plurality of second pads 36 are also provided in a region that is not covered by the sensor chip 20. Each of the first and second pads 35 and 36 is formed of aluminum or an aluminum-silicon alloy (AlSi), for example.

The first pads 35 are connected to the respective pads 24 of the sensor chip 20 via the first bonding wires 43. The second pads 36 are connected to the respective lead terminals 41 via the second bonding wires 44. Each of the lead terminals 41 is disposed in the surroundings of the ASIC chip 30.

In manufacturing, a position where the ASIC chip 30 is mounted is determined by a reference to the lead terminals 41. A position where the sensor chip 20 is mounted on the ASIC chip 30 is determined by a reference to a position where either of the ASIC chip 30 or a lead terminal 41 is disposed. The opening 50 is formed by transfer molding using a mold, or the like. In this case, a position of a mold is determined by a reference to the lead terminals 41.

A reference numeral 25 illustrated in FIG. 3 represents an allowed formation region where the humidity detecting unit 21 and the temperature detecting unit 22 are formed on the sensor chip 20. The allowed formation region 25 is set in a desired region in the opening 50 so as to ensure exposure of the humidity detecting unit 21 and the temperature detecting unit 22 from the opening 50, even in a case of largest displacement of the ASIC chip 30 or/and the sensor chip 20 from the mold occurring during mounting. The humidity detecting unit 21 and the temperature detecting unit 22 are reliably exposed from the opening 50 regardless of the above displacement, when they are disposed in the allowed formation region 25.

[Configuration of Sensor Chip]

Hereafter, a configuration of the sensor chip 20 will be described.

Figure 4:
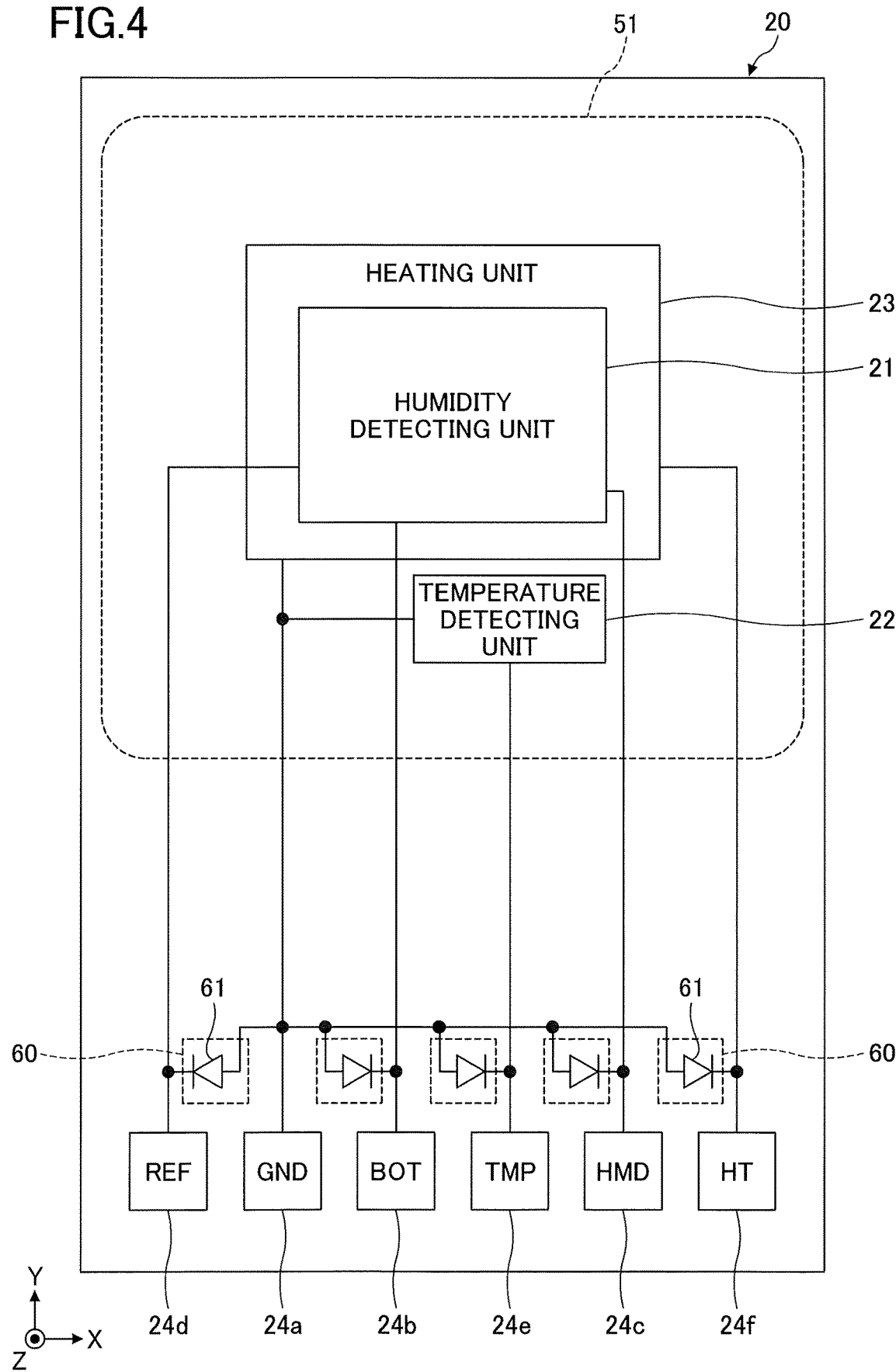
FIG. 4 is a plan view schematically illustrating an example of a configuration of a sensor chip.

FIG. 4 is a plan view schematically illustrating an example of a configuration of a sensor chip 20. The pads 24 are terminals that are used for applying a voltage from the external or detecting a potential. In FIG. 4, the respective pads 24 illustrated in FIG. 3 are distinctively indicated by pads 24a-24f. Note that when it is not necessary to distinguish between the pads 24a and 24f, they may be simply referred to as pads 24.

A pad 24a serves as a ground electrode terminal (GND) that is grounded to a ground potential. The pad 24a is electrically connected to units such as the temperature detecting unit 22 and the heating unit 23, via corresponding interconnect(s) or a substrate.

A pad 24b is a lower electrode terminal (BOT) that is electrically connected to a lower electrode 83 of the humidity detecting unit 21. The pad 24b is used to supply a drive voltage to the lower electrode 83. A pad 24c is a terminal for humidity detection (HMD) that is electrically connected to an upper electrode 84 of the humidity detecting unit 21. The pad 24c is used to acquire a detected signal of relative humidity from the upper electrode 84. A pad 24d is a reference electrode terminal (REF) that is electrically connected to a reference electrode 82 of the humidity detecting unit 21. The pad 24d is used to acquire a reference signal for humidity detection from the reference electrode 82.

A pad 24e is a terminal for temperature detection (TMP) that is electrically connected to the temperature detecting unit 22. The pad 24e is used to acquire a detected signal of temperature. A pad 24f is a terminal for heating (HT) that is electrically connected to the heating unit 23. The pad 24f is used to supply a drive voltage for driving the heating unit 23.

Electrostatic discharge (ESD) protection circuits 60 are respectively connected to the pads 24b to 24f other than the pad 24a. Each ESD protection circuit 60 is connected between the pad 24a as a ground electrode terminal and a given pad as an input terminal or an output terminal from among the pads 24b-24f. In the present embodiment, each ESD protection circuit 60 includes one diode 61. An anode of the diode 61 is connected to the pad 24a, and a cathode is connected to a given pad among the pads 24b-24f.

Each ESD protection circuit 60 is preferably disposed in proximity to the pads 24b-24f so as to be as far as possible away from the effective opening 51. Each ESD protection circuit 60 is sealed with the mold resin 40. Thereby, unwanted charge caused by the photoelectric effect is not generated.

[Configuration of ESD Protection Circuit]

Hereafter, a configuration of the ESD protection circuit 60 will be described.

Figure 5:
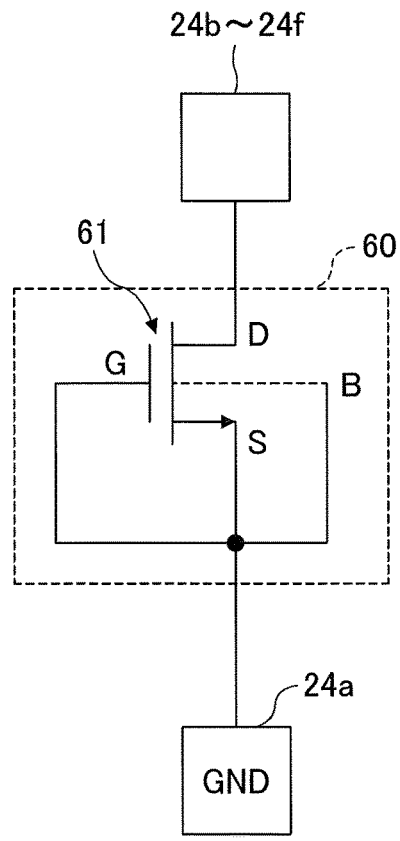
FIG. 5 is a circuit diagram illustrating an example of a configuration of an ESD protection circuit.

FIG. 5 is a circuit diagram illustrating an example of a configuration of the ESD protection circuit 60. As illustrated in FIG. 5, a diode 61 that constitutes the ESD protection circuit 60 is formed by an N-channel MOS (Metal-Oxide-Semiconductor) transistor (which is hereafter referred to as an NMOS transistor), for example. Specifically, the diode 61 is formed by short-circuiting (so-called diode connection) a source, a gate, and a back gate of the NMOS transistor. Such a short circuit serves as an anode. A drain of the NMOS transistor serves as a cathode.

Figure 6:
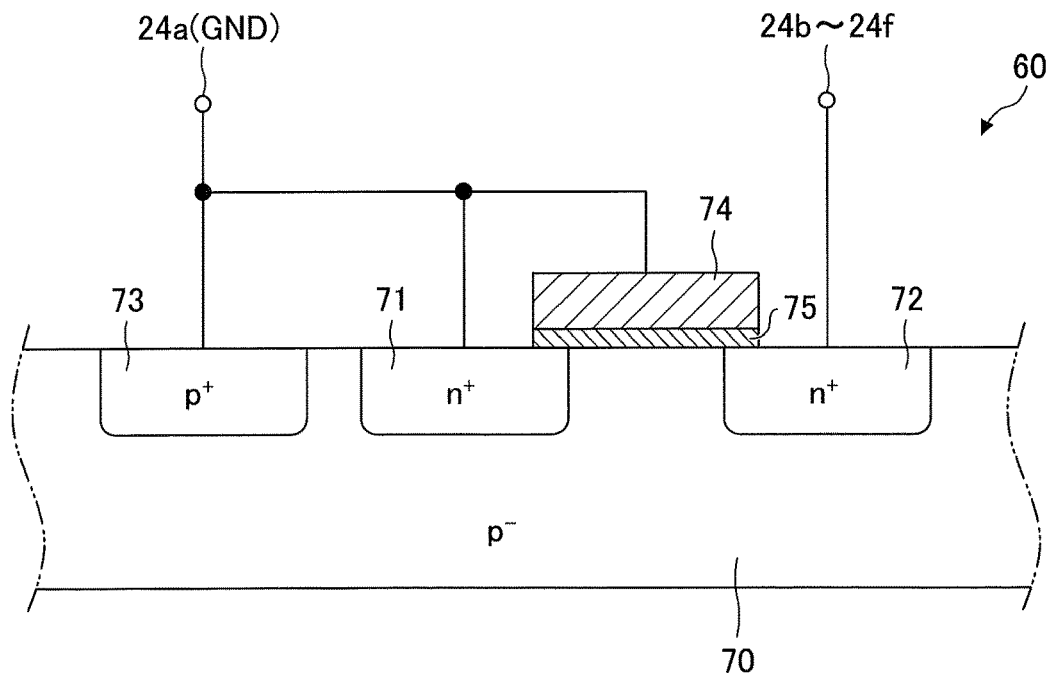
FIG. 6 is a diagram illustrating an example of a layer structure of an NMOS transistor that constitutes the ESD protection circuit.

FIG. 6 is a diagram illustrating an example of a layer structure of the NMOS transistor that constitutes the ESD protection circuit 60. The NMOS transistor has two n-type diffusion layers 71 and 72, each of which is formed in a surface layer of a p-type semiconductor substrate 70 for constituting part of the sensor chip 20, a contact layer 73, and a gate electrode 74. The gate electrode 74 is formed on a surface of the p-type semiconductor substrate 70 via a gate insulating film 75. The gate electrode 74 is approximately disposed between the two n-type diffusion layers 71 and 72.

For example, the n-type diffusion layer 71 serves as a source, and the n-type diffusion layer 72 serves as a drain. The contact layer 73 is a low resistance layer (p-type diffusion layer) for an electrical connection to the p-type semiconductor substrate 70 as a back gate. The n-type diffusion layer 71, the gate electrode 74, and the contact layer 73 are commonly connected to be short-circuited. Such a short circuit serves as an anode, and the n-type diffusion layer 72 serves as a cathode.

The p-type semiconductor substrate 70 is a p-type silicon substrate, for example. The gate electrode 74 is formed of metal or polycrystalline silicon (polysilicon). For example, a gate insulating film 75 is formed by an oxide film such as silicon dioxide.

[Configuration of Humidity Detecting Unit]

Hereafter, a configuration of the humidity detecting unit 21 will be described.

Figure 7:
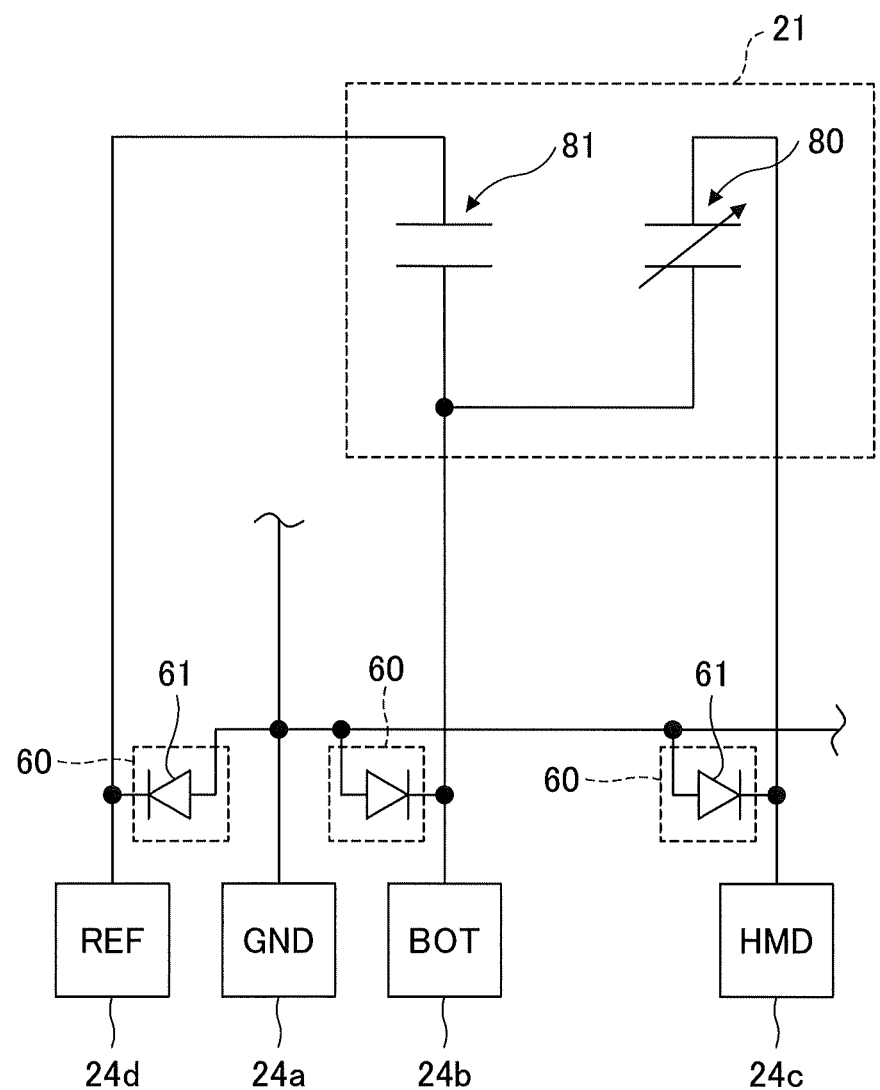
FIG. 7 is a circuit diagram illustrating an example of a configuration of a humidity detecting unit.

FIG. 7 is a circuit diagram illustrating an example of a configuration of the humidity detecting unit 21. As illustrated in FIG. 7, the humidity detecting unit 21 includes a capacitor 80 for humidity detection and a capacitor 81 for reference.

One electrode (the lower electrode 83) of the humidity detecting unit 21 is connected to the pad 24b as a lower electrode terminal. Another electrode (the upper electrode 84) of the humidity detecting unit 21 is connected to the pad 24c as a terminal for humidity detection. One electrode of the capacitor 81 for reference is common to the one electrode (the lower electrode 83) of the humidity detecting unit 21. Another electrode (the reference electrode 82) of the capacitor 81 for reference is connected to the pad 24d as a reference electrode terminal.

A moisture sensitive film 86 is provided between the electrodes of the capacitor 80 for humidity detection, as described below. The moisture sensitive film 86 is formed of a high polymeric material such as polyimide, which absorbs moisture of the air and changes a permittivity according to an amount of absorbed water. The capacitor 80 for humidity detection changes capacitance in accordance with an amount of moisture absorbed by the moisture sensitive film 86.

A second insulating film 111 (see FIG. 9) is provided between the electrodes of the capacitor 81 for reference, as described below. The second insulating film 111 is formed of an insulating material such as silicon dioxide (SiO2) which does not absorb moisture. Accordingly, capacitance of the capacitor 81 for reference either does not change or any change is negligible.

An amount of moisture contained in the moisture sensitive film 86 changes depending on humidity in surroundings of the humidity detecting device 10. In this case, relative humidity can be measured by detecting a difference between capacitance of the capacitor 80 for humidity detection and capacitance of the capacitor 81 for reference. Such relative humidity is measured by a humidity-measurement processing unit 31 (see FIG. 12) in the ASIC chip 30, based on a potential at the pad 24c as a terminal for humidity detection and a potential at the pad 24d as a reference electrode terminal.

[Configuration of Temperature Detecting Unit]

Hereafter, a configuration of the temperature detecting unit 22 will be described.

Figure 8:
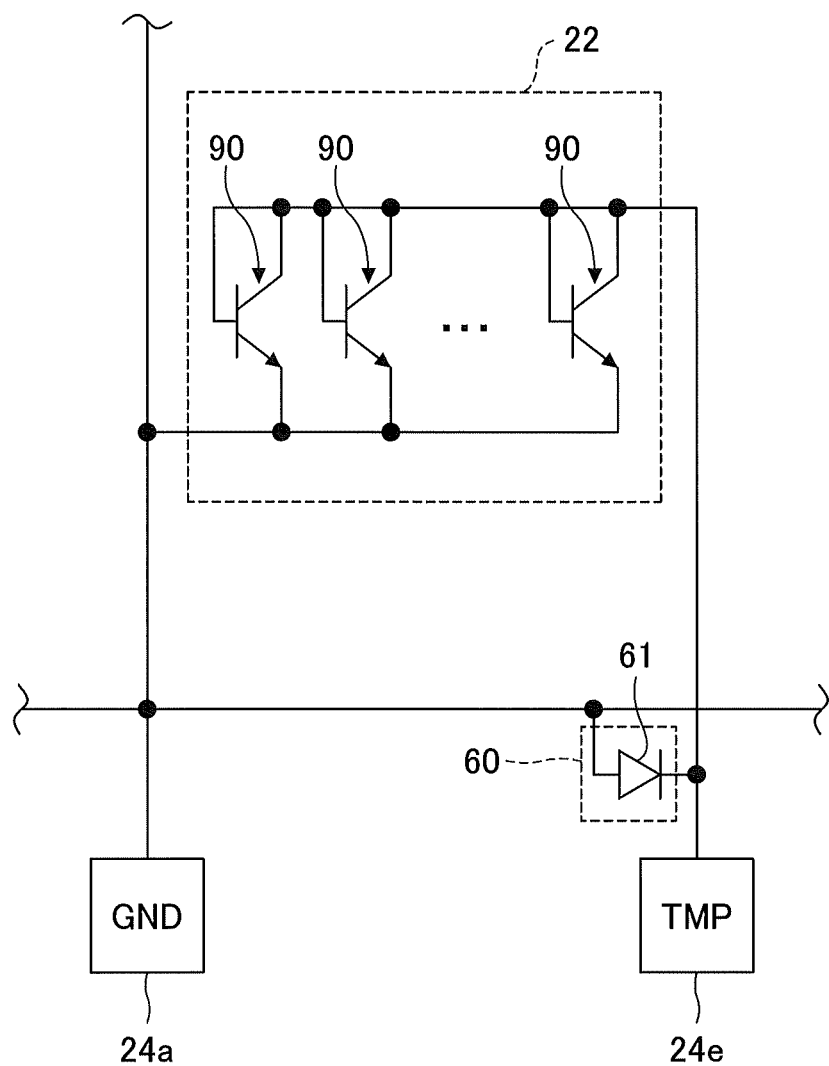
FIG. 8 is a circuit diagram illustrating an example of a configuration of a temperature detecting unit.

FIG. 8 is a circuit diagram illustrating an example of a configuration of the temperature detecting unit 22. The temperature detecting unit 22 is a band-gap type temperature sensor that detects temperature by utilizing a physical property changing proportionally depending on a change in temperature, with respect to a band gap of a semiconductor. For example, the temperature detecting unit 22 may include one or more bipolar transistors in which any two from among a base, an emitter and a collector are connected to each other to form two terminals. By detecting resistance between the two terminals, temperature can be measured.

As illustrated in FIG. 8, in the present embodiment, the temperature detecting unit 22 includes a plurality of (e.g., eight) npn-type bipolar transistors 90 connected in parallel, whose bases are connected to respective collectors. In such a manner, with respect to each of the plurality of bipolar transistors 90 connected in parallel, a junction area of a p-n junction is increased, thereby improving resistance properties in terms of ESD.

An emitter of each bipolar transistor 90 is connected to the pad 24a as a ground electrode terminal. A base and a collector of each bipolar transistor 90 are connected to the pad 24e as a terminal for temperature detection.

Temperature measurement is performed based on a potential at the pad 24e by a temperature-measurement processing unit 32 (see FIG. 12) in the ASIC chip 30.

[Element Structure of Sensor Chip]

Hereafter, an element structure of the sensor chip 20 will be described.

Figure 9:
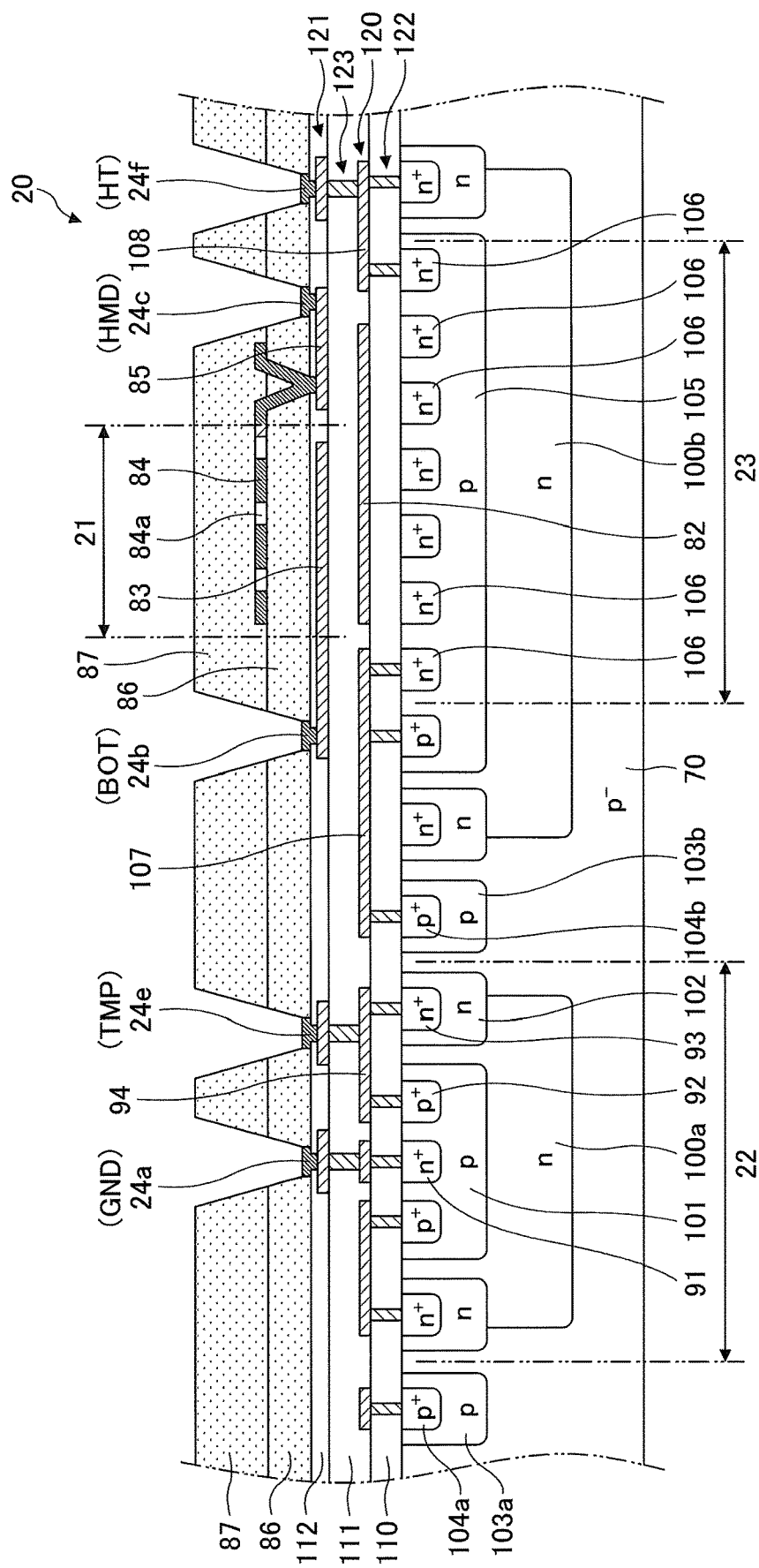
FIG. 9 is a schematic cross-sectional view for explaining an example of an element structure of the sensor chip.

FIG. 9 is a schematic cross-sectional view for explaining an example of an element structure of the sensor chip 20. Note that in FIG. 9, the pads 24a, 24b, 24c and 24e are illustrated in a same cross section as the humidity detecting unit 21, the temperature detecting unit 22, and the heating unit 23, for facilitating understanding of the structure. This, however, does not mean that the pads are actually present in a same cross section. Also, a cross-section of each of the humidity detecting unit 21, the temperature detecting unit 22 and the heating unit 23 is simplified to facilitate understanding of the structure; accordingly, a positional relationship between those units, etc. is different from an actual one.

As illustrated in FIG. 9, the sensor chip 20 is formed, including the p-type semiconductor substrate 70 described above. In the p-type semiconductor substrate 70, a first deep-n-well 100a and a second deep-n-well 100b are formed. The temperature detecting unit 22 is formed in the first deep-n-well 100a. The heating unit 23 is formed in the second deep-n-well 100b.

In a surface layer of the p-type semiconductor substrate 70 in which neither the first deep-n-well 100a nor the second deep-n-well 100b is formed, p-wells 103a and 103b are formed. In respective surface layers of the p-well 103a and 103b, contact layers 104a and 104b each of which includes a p-type diffusion region are formed. Each of the contact layers 104a and 104b is a low resistance layer (p-type diffusion layer) for electrically connecting a given interconnect layer formed over the p-type semiconductor substrate 70 to the p-type semiconductor substrate 70.

In a surface layer of the first deep-n-well 100a, a p-well 101 and an n-well 102 are formed. An n-type diffusion layer 91 and a p-type diffusion layer 92 are formed in a surface layer of the p-well 101. An n-type diffusion layer 93 is formed in a surface layer of the n-well 102. The n-type diffusion layer 91, the p-type diffusion layer 92, and the n-type diffusion layer 93 constitute the npn-type bipolar transistor 90 described above, and serve as an emitter, a base, and a collector, respectively.

A p-well 105 is formed in a surface layer of the second deep-n-well 100b. One or more n-type diffusion layers 106 may be formed in a surface layer of the p-well 105. In the present embodiment, a plurality of n-type diffusion layers 106 are formed. For example, n-type diffusion layers 106 extend in a direction perpendicular to a plane of the paper, and are wholly arranged in a one-dimensional grating pattern (see FIG. 11). Each n-type diffusion layer 106 has a predetermined resistance value (e.g., a sheet resistance value of about 3Ω), and serves as a resistor that generates heat when a current flows. In such a manner, each n-type diffusion layer 106 constitutes the heating unit 23.

Each layer in the p-type semiconductor substrate 70 is formed by a general semiconductor manufacturing process (CMOS process). Each n-type diffusion layer 106 as a resistor is formed by a same manufacturing process as the n-type diffusion layers 91 and 93 that constitute part of the temperature detecting unit 22. The n-type diffusion layers 106, 91, and 93 are formed simultaneously by an ion-implantation process in which a substrate is doped with an impurity used in ion implantation of an n-type impurity (e.g., phosphorus). In such a manner, each n-type diffusion layer 106 as a resistor has a same depth from the surface of the p-type semiconductor substrate 70 as the n-type diffusion layers 91 and 93 that constitute part of the temperature detecting unit 22. Each n-type diffusion layer 106 may have a same depth from the surface of the p-type semiconductor substrate 70 as the p-type diffusion layer 92 that constitutes part of the temperature detecting unit 22.

Note that the n-type diffusion layers 106, 91, and 93 may be formed by a heating diffusion process in which an impurity is added by heat treatment, instead of an ion implantation process.

The n-type diffusion layers 71 and 72 of each of the ESD protection circuit 60 described above are also formed by a same manufacturing process (ion implantation process or thermal diffusion process) as the n-type diffusion layers 106, 91, and 93. The contact layer 73 is formed by a same manufacturing process (ion implantation process or thermal diffusion process) as the p-type diffusion layer 92, the contact layers 104a and 104b, and the like.

Other layers in the p-type semiconductor substrate 70 primarily serve as contact layers; accordingly, the explanation is omitted for those layers.

A first insulating film 110, the second insulating film 111, and a third insulating film 112 are sequentially laminated on the surface of the p-type semiconductor substrate 70. These are formed of an insulating material such as silicon dioxide (SiO2) or silicon nitride (SiN).

A first interconnect layer 120 is formed on the first insulating film 110. A second interconnect layer 121 is formed on the second insulating film 111. The first interconnect layer 120 is overlaid with the second insulating film 111. The second interconnect layer 121 is overlaid with the third insulating film 111. Each of the first interconnect layer 120 and the second interconnect layer 121 is formed of a conductive material such as aluminum.

A first plug layer (first via) 122 that has a plurality of first plugs for connecting the first interconnect layer 120 to the p-type semiconductor substrate 70 is formed in the first insulating film 110. A second plug layer (second via) 123 that has a plurality of second plugs for connecting the first interconnect layer 120 to the second interconnect layer 121 is formed in the second insulating film 111. Each of the first plug layer 122 and the second plug layer 123 is formed of a conductive material such as tungsten.

For example, an interconnect 94 for connecting a base of each bipolar transistor 90 to a corresponding collector is formed in the first interconnect layer 120, and is connected to the p-type diffusion layers 92 and the n-type diffusion layers 93 via the first plug layer 122. The interconnect 94 is also connected to the pad 24e as a terminal for temperature detection via the second plug layer 123 and the second interconnect layer 121. The n-type diffusion layer 91 as an emitter of each bipolar transistor 90 is also connected to the pad 24a as a ground electrode terminal via the first plug layer 122, the first interconnect layer 120, and the second interconnect layer 121.

An interconnect 107 for grounding one end portion of the heating unit 23 to a ground potential is formed in the first interconnect layer 120, and is connected to each n-type diffusion layer 106 and the contact layer 104b via the first plug layer 122. An interconnect 108 for connecting another end portion of the heating unit 23 to the pad 24f as a terminal for heating is connected to each n-type diffusion layer 106 via the first plug layer 122, and is connected to the pad 24f via the second plug layer 123 and the second interconnect layer 121.

The reference electrode 82 used for the capacitor 81 for reference is formed by the first interconnect layer 120, and is connected to the pad 24d (not shown in FIG. 9) as a reference electrode terminal, via the second plug layer 123 and the second interconnect layer 121.

The lower electrode 83 used for the capacitor 80 for humidity detection is formed by the second interconnect layer 121, and is connected to the pad 24b as a lower electrode terminal. Further, an interconnect 85 for connecting the upper electrode 84, which is used for the capacitor 80 for humidity detection, to the pad 24c as a humidity detecting terminal is formed by the second interconnect layer 121. Note that the lower electrode 83 is disposed at a location opposite to the reference electrode 82, via the second insulating film 111.

Each of the pads 24a-24f is formed of a conductive material such as aluminum, and is disposed on the third insulating film 112. Each of the pads 24a-24f is connected to the second interconnect layer 121, passing through the third insulating film 112.

The moisture sensitive film 86 is formed on the third insulating film 112. The moisture sensitive film 86 has a thickness of 0.5 µm to 1.5 µm, and is formed of a polymeric material that is capable of easily absorbing and desorbing the water molecule in accordance with the humidity. The moisture sensitive film 86 is a polyimide film that has a thickness of 1 µm, for example. Note that a polymeric material that forms the moisture sensitive film 86 is not limited to polyimide, and may include cellulose, polymethyl methacrylate (PMMA), polyvinyl alcohol (PVA), or the like.

An upper surface of the moisture sensitive film 86 is flat, and on this upper surface, a flat-plate type upper electrode 84 is formed. The upper electrode 84 is formed in a location opposite to the lower electrode 83, via the moisture sensitive film 86. A portion of the upper electrode 84 is connected to the interconnect 85. For example, the upper electrode 84 is a conductive film that is formed of aluminum metal that has a thickness of 200 nm, or the like. A plurality of openings 84a are also formed in the upper electrode 84 in order to efficiently incorporate water molecules in the air into the humidity sensitive film 86.

An overcoat film 87 is disposed on the moisture sensitive film 86 so as to cover the upper electrode 84. The overcoat film 87 is formed of a polymeric material, e.g., a same material as the moisture sensitive film 86. A thickness of the overcoat film 87 is 0.5 µm to 10 µm, for example.

Openings are formed in the moisture sensitive film 86 and the overcoat film 87 in order to expose the pads 24a to 24f.

In such a manner, the capacitor 80 for humidity detection, which is a parallel-plate type, is configured by the lower electrode 83 and the upper electrode 84. Also, the capacitor 81 for reference, which is a parallel-plate type, is configured by the lower electrode 83 and the reference electrode 82. The capacitor 80 for humidity detection as well as the capacitor 81 for reference are disposed over the heating unit 23.

In such a manner, when the heating unit 23 produces heat, the humidity sensitive film 86 is heated, between the lower electrode 83 and the upper electrode 84. Thereby, the humidity sensitive film 86 adsorbs an amount of water molecules in accordance with humidity, due to increased temperature upon heating. Accordingly, a permittivity of the humidity sensitive film 86 changes, and thus capacitance of the capacitor 80 for humidity detection is decreased. The temperature detecting unit 22 also detects increased temperature caused by the heating unit 23.

Figure 10:
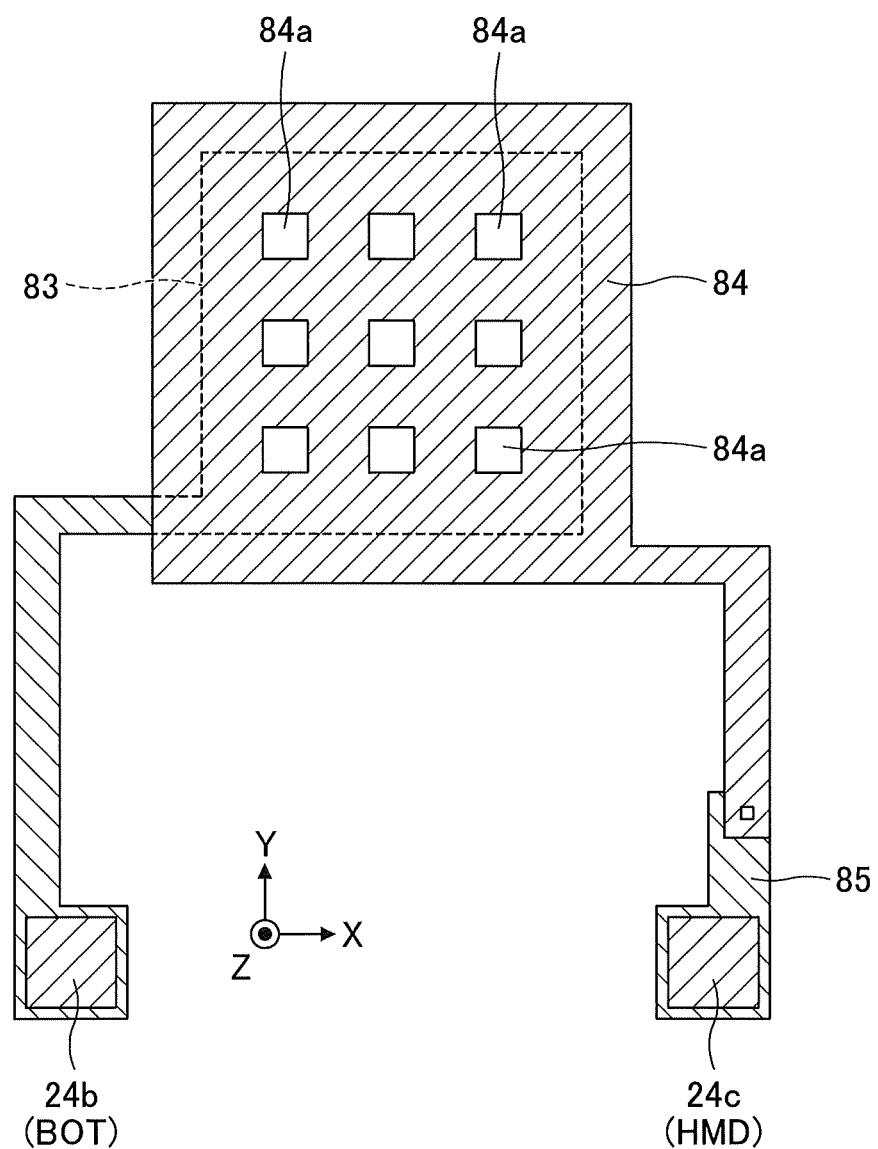
FIG. 10 is a plan view illustrating an example of the shape of a lower electrode and an upper electrode.

FIG. 10 is a plan view illustrating an example of the shape of the lower electrode 83 and the upper electrode 84. As illustrated in FIG. 10, each of the lower electrode 83 and the upper electrode 84 has a rectangular shape. The upper electrode 84 is formed so as to cover lower electrode 83.

A given opening 84a is preferably as small as possible. In such a manner, leakage of an electric field in the air is prevented as each opening 84a is small. In the present embodiment, many openings 84a are formed. Note that the shape of each opening 84a is not limited to a square, and may be an elongated rectangle, or a circle. The openings 84a may be arranged in a staggered pattern. Preferably, circular openings 84a may be arranged in a staggered pattern.

Note that although not illustrated in FIG. 10, a rectangular reference electrode 82 is formed below the lower electrode 83.

Figure 11:
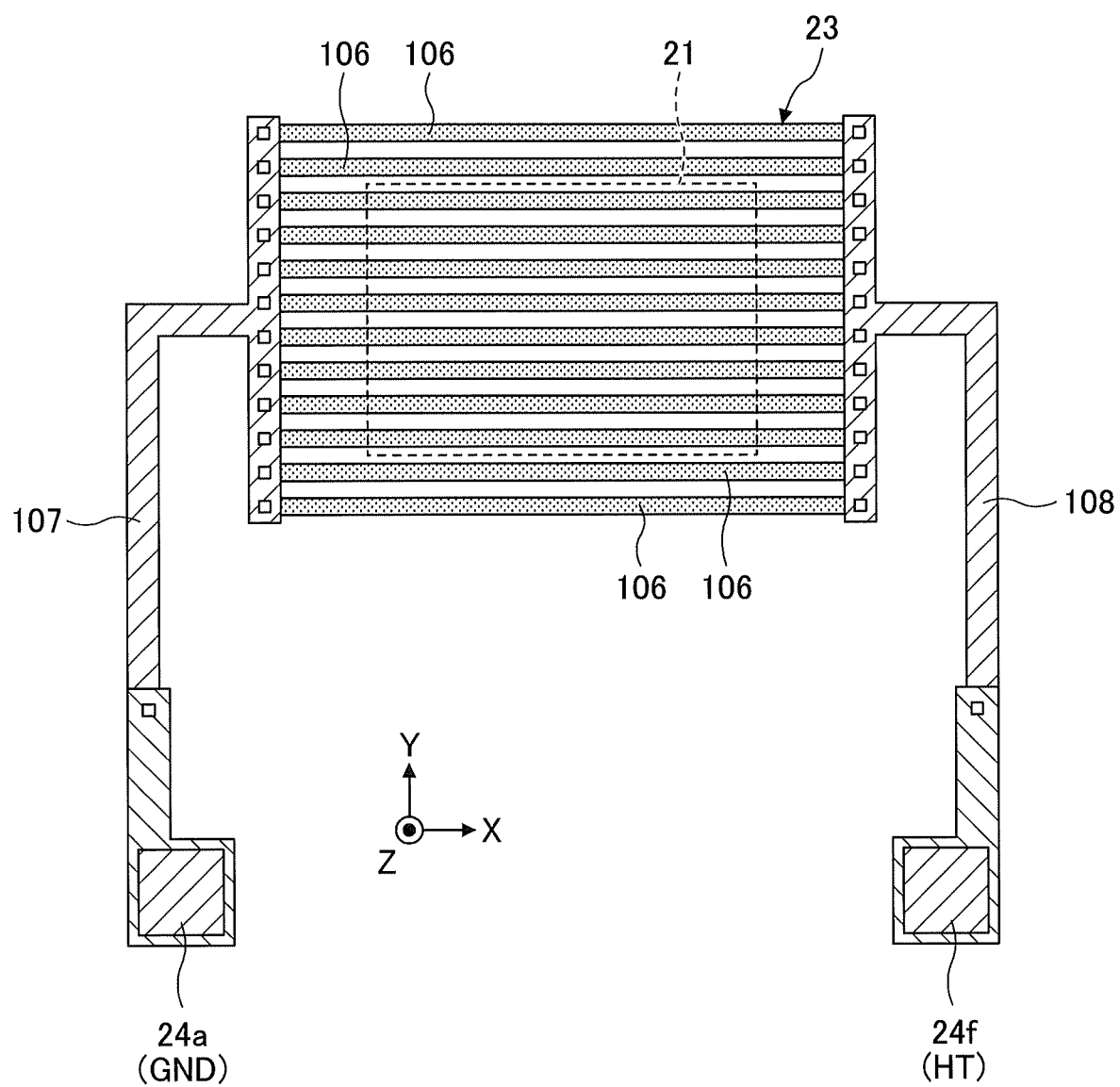
FIG. 11 is a plan view illustrating an example of the shape of n-type diffusion layers that constitute a heating unit.

FIG. 11 is a plan view illustrating an example of the shape of the n-type diffusion layers 106 that constitute the heating unit 23. As illustrated in FIG. 11, the n-type diffusion layers 106 are arranged in a one-dimensional grid pattern, in which a plurality of elongated, rectangular regions are arranged parallel to each other. One end of each of the n-type diffusion layers 106 in the one-dimensional grid pattern is connected to the interconnect 107, and another end is connected to the interconnect 108. The heating unit 23 is positioned below the humidity detecting unit 21 so as to cover, in a plan view, the entire humidity detecting unit 21.

[Functional Configuration of ASIC Chip]

Hereafter, functional units used in the ASIC chip 30 will be described.

Figure 12:
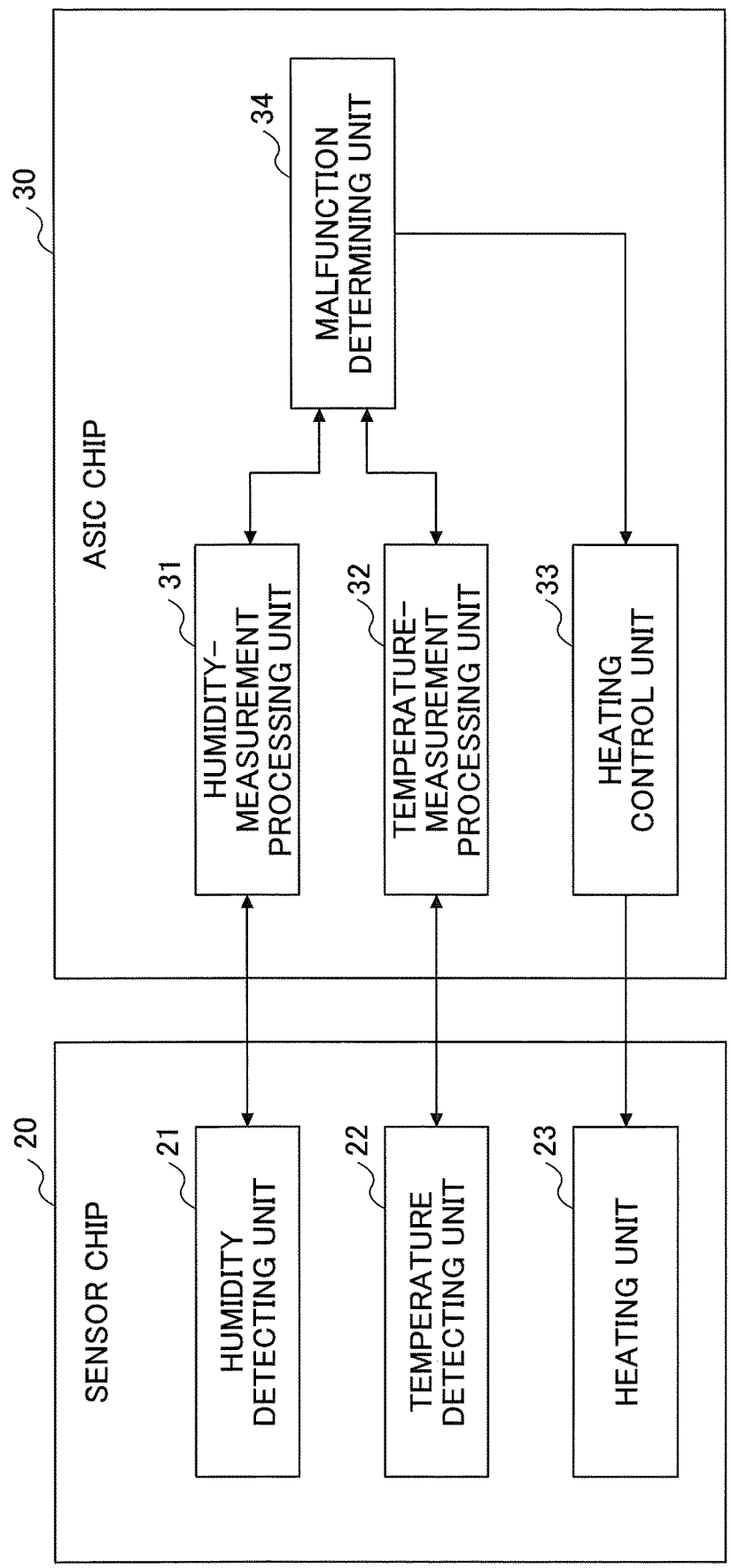
FIG. 12 is a block diagram illustrating an example of a functional configuration of an ASIC chip.

FIG. 12 is a block diagram illustrating an example of a functional configuration of the ASIC chip 30. As illustrated in FIG. 12, the ASIC chip 30 includes a humidity-measurement processing unit 31, a temperature-measurement processing unit 32, a heating control unit 33, and a malfunction determining unit 34.

The humidity-measurement processing unit 31 applies a predetermined driving voltage to the pad 24b as a lower electrode terminal, and detects a potential at the pad 24c as a terminal for humidity detection, as well as a potential at the pad 24d as a reference electrode terminal. The humidity-measurement processing unit 31 calculates relative humidity (% RH) based on a difference in potential between the pads 24c and 24d.

The temperature-measurement processing unit 32 detects a potential at the pad 24e as a terminal for temperature detection, and calculates temperature corresponding to the detected potential.

The heating control unit 33 applies a predetermined driving voltage to the pad 24f as a terminal for heating, and causes the heating unit 23 to which a current (e.g., about 10 mA) flows to produce heat. The heating control unit 33 controls an amount of produced heat, by controlling a voltage applied to the pad 24f.

The malfunction determining unit 34 determines whether the humidity detecting device 10 malfunctions based on relative humidity measured by the humidity-measurement processing unit 31 and temperature measured by the temperature-measurement processing unit 32. In determination of malfunction, the malfunction determining unit 34 transmits, to the heating control unit 33, an instruction to start or finish heating by the heating unit 23.

[Planar Layout of Sensor Chip]

Hereafter, a specific planar layout of the sensor chip 20 will be described.

FIGS. 13 to 20 are diagrams illustrating a planar layout and a cross-sectional structure of the temperature detecting unit 22 of the sensor chip 20, including the surroundings of the temperature detecting unit 22.

Figure 13:
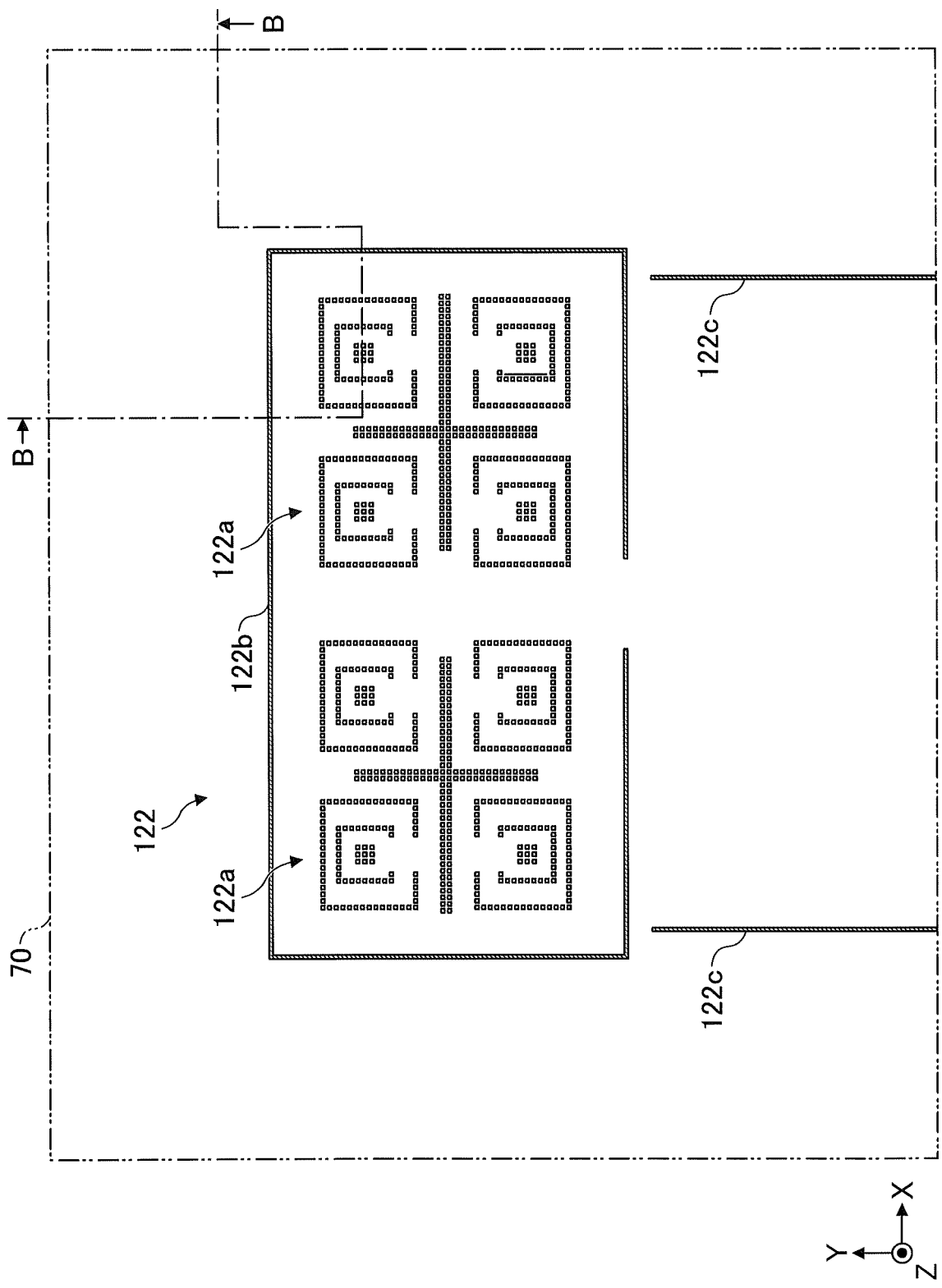
FIG. 13 is a plan view illustrating an example of a pattern of a first plug layer.
Figure 14:
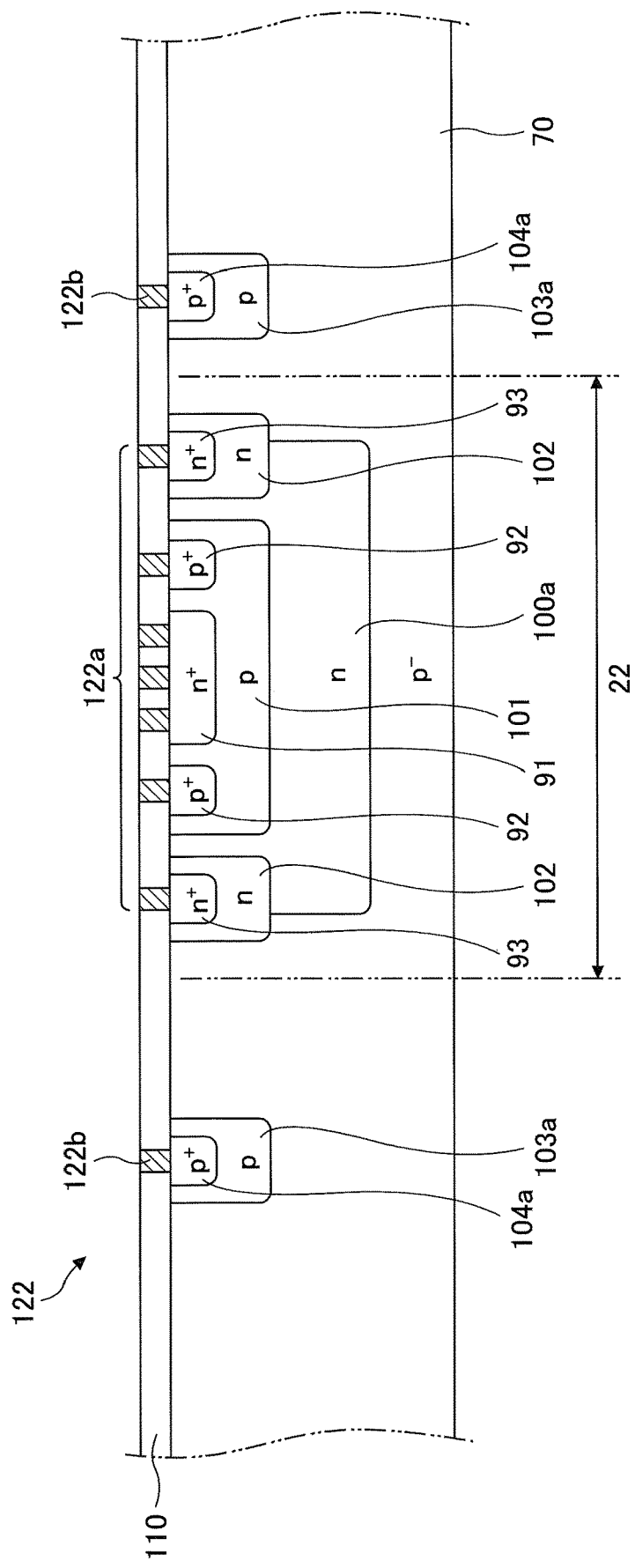
FIG. 14 is a schematic cross-sectional view taken along the B-B line in FIG. 13.

FIG. 13 is a plan view illustrating an example of a pattern of the first plug layer 122 formed on the p-type semiconductor substrate 70. FIG. 14 is a schematic cross-sectional view taken along the B-B line in FIG. 13.

As illustrated in FIG. 14, in the p-type semiconductor substrate 70, impurity diffusion layers, wells, contact layers, and the like are formed, corresponding to a region where the temperature detecting unit 22 illustrated in FIG. 9 is formed. These regions are same as above; accordingly, the explanation is omitted.

As illustrated in FIG. 13, the first plug layer 122, as a coupling layer to a substrate, includes a plug group 122a, light-blocking walls 122b and 122c, and the like. The plug group 122a has a plurality of plugs that are arranged in a dot pattern. For example, each dot is square with each side being 0.6 µm. Each of the light-blocking walls 122b and 122c is formed by linearly arranged plugs. With respect to each of the light-blocking walls 122b and 122c, each plug is 0.6 µm in width, for example.

Each of the plug group 122a and the light-blocking walls 122b and 122c is formed by embedding a conductive material such as tungsten in openings (contact holes), the openings being formed in a predetermined pattern on the first insulating film 110 that is provided on the p-type semiconductor substrate 70.

Figure 15:
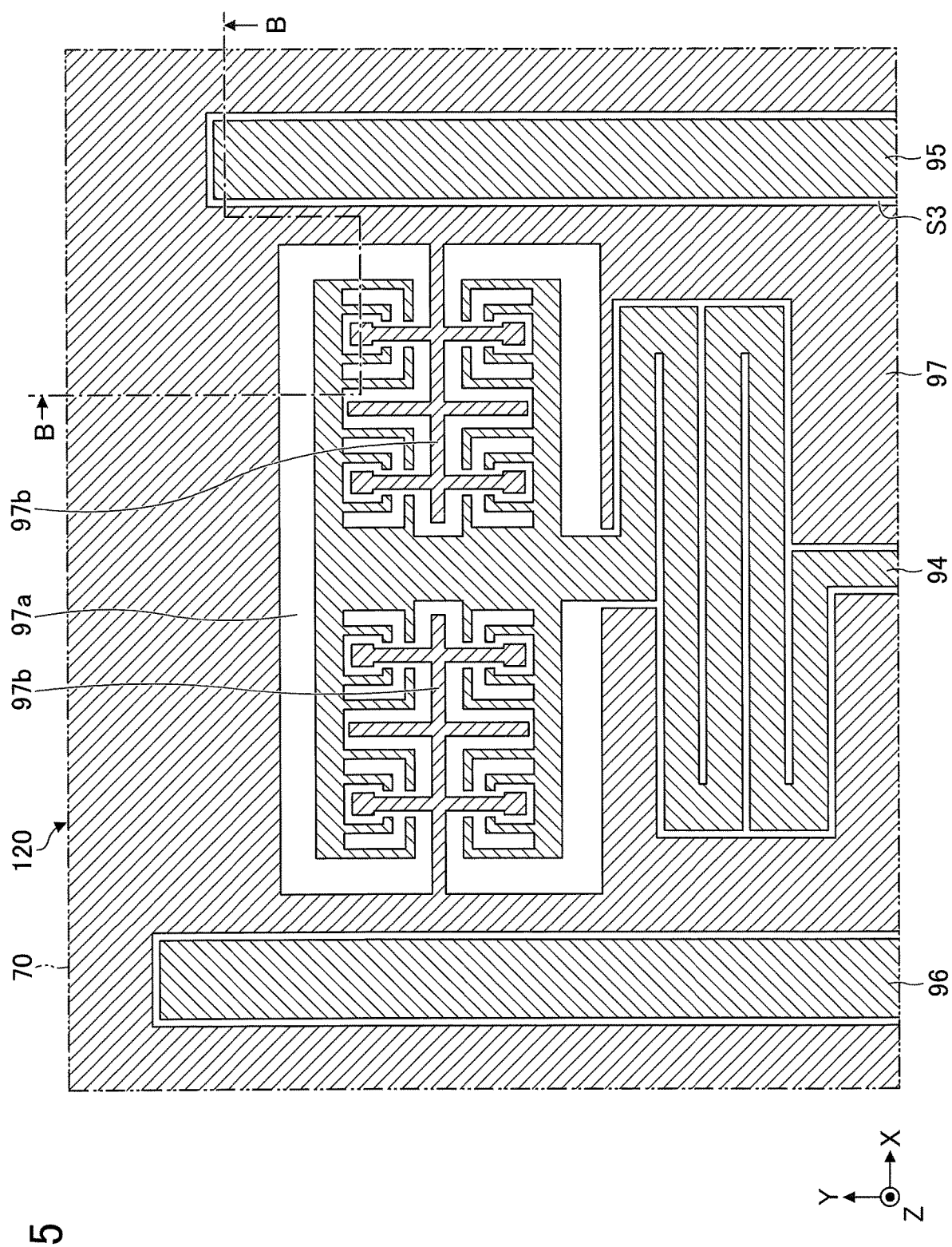
FIG. 15 is a plan view illustrating an example of a pattern of a first interconnect layer.
Figure 16:
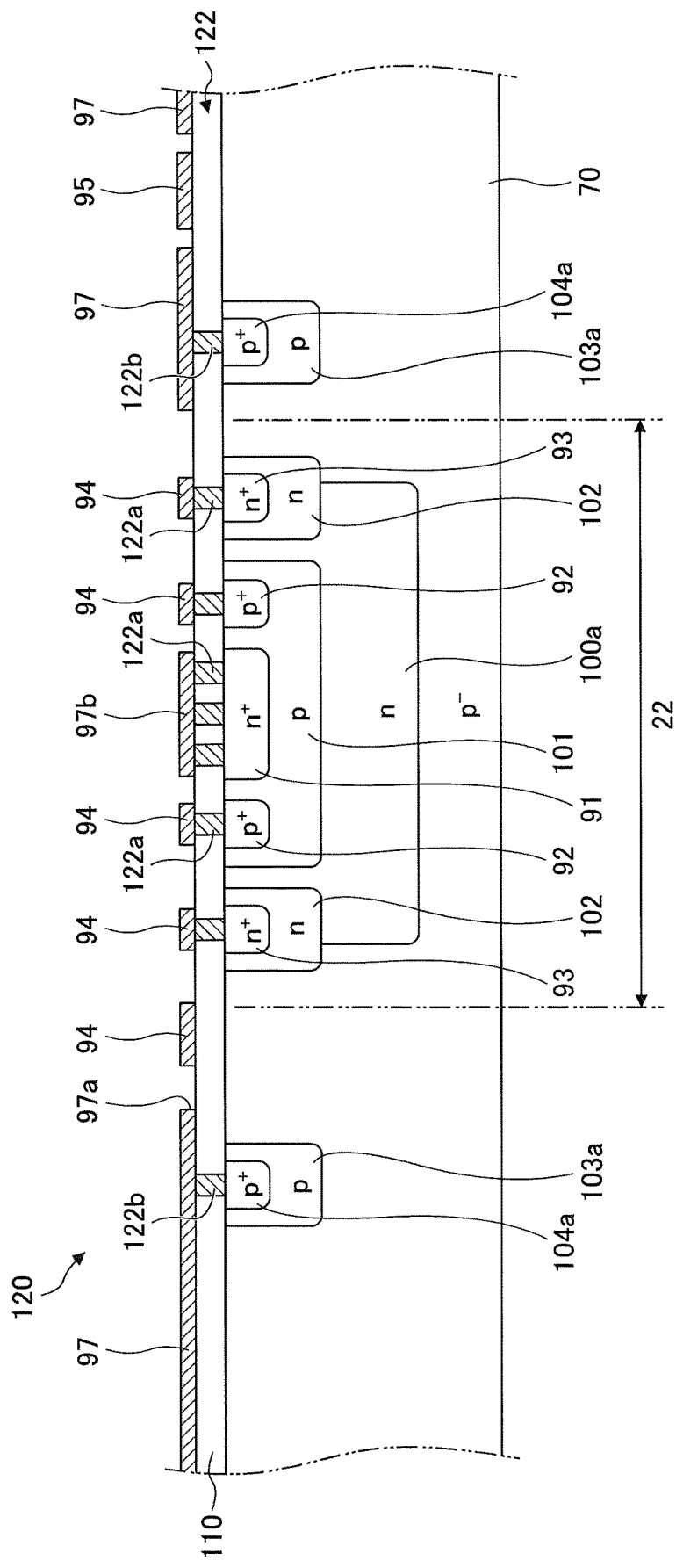
FIG. 16 is a schematic cross-sectional view taken along the B-B line in FIG. 15.

FIG. 15 is a plan view illustrating an example of a pattern of the first interconnect layer 120 formed on the first plug layer 122. FIG. 16 is a schematic cross-sectional view taken along the B-B line in FIG. 15.

As illustrated in FIG. 15, the first interconnect layer 120 includes an interconnect 94 that is electrically connected to the pad 24e as a terminal for temperature detection, an interconnect 95 that is electrically connected to the pad 24c as a terminal for humidity detection, an interconnect 96 that is electrically connected to the pad 24b as a lower electrode terminal, a conductive film 97 that is electrically connected to the pad 24a as a ground electrode terminal, and the like.

The interconnects 94, 95 and 96, and the conductive film 97 are respectively connected to the pads 24e, 24c, 24b, and 24a via interconnect(s) (not shown) that are formed in the second interconnect layer 121.

The conductive film 97 has an opening 97a for exposing the temperature detecting unit 22 and interconnects 97b for supplying a ground potential to the temperature detecting unit 22 that is formed in the opening 97a.

The first interconnect layer 120 is formed by evaporating a conductive film, such as aluminum, on the first insulating film 110 as well as by patterning the conductive film with photolithography and etching. Note that slits are formed between the interconnect 94 and the conductive film 97, between the interconnect 95 and the conductive film 97, and between the interconnect 96 and the conductive film 97, so as to electrically separate the interconnect and the film.

As illustrated in FIG. 16, the interconnect 94 is connected to p-type diffusion layers 92 and n-type diffusion layers 93 in the p-type semiconductor substrate 70 via the plug group 122a. The conductive film 97 is connected to the contact layer 104a via light-blocking walls 122b and 122c. A given interconnect 97b formed integrally with the conductive film 97 is connected to the n-type diffusion layer 91 via the plug group 122a.

Figure 17:
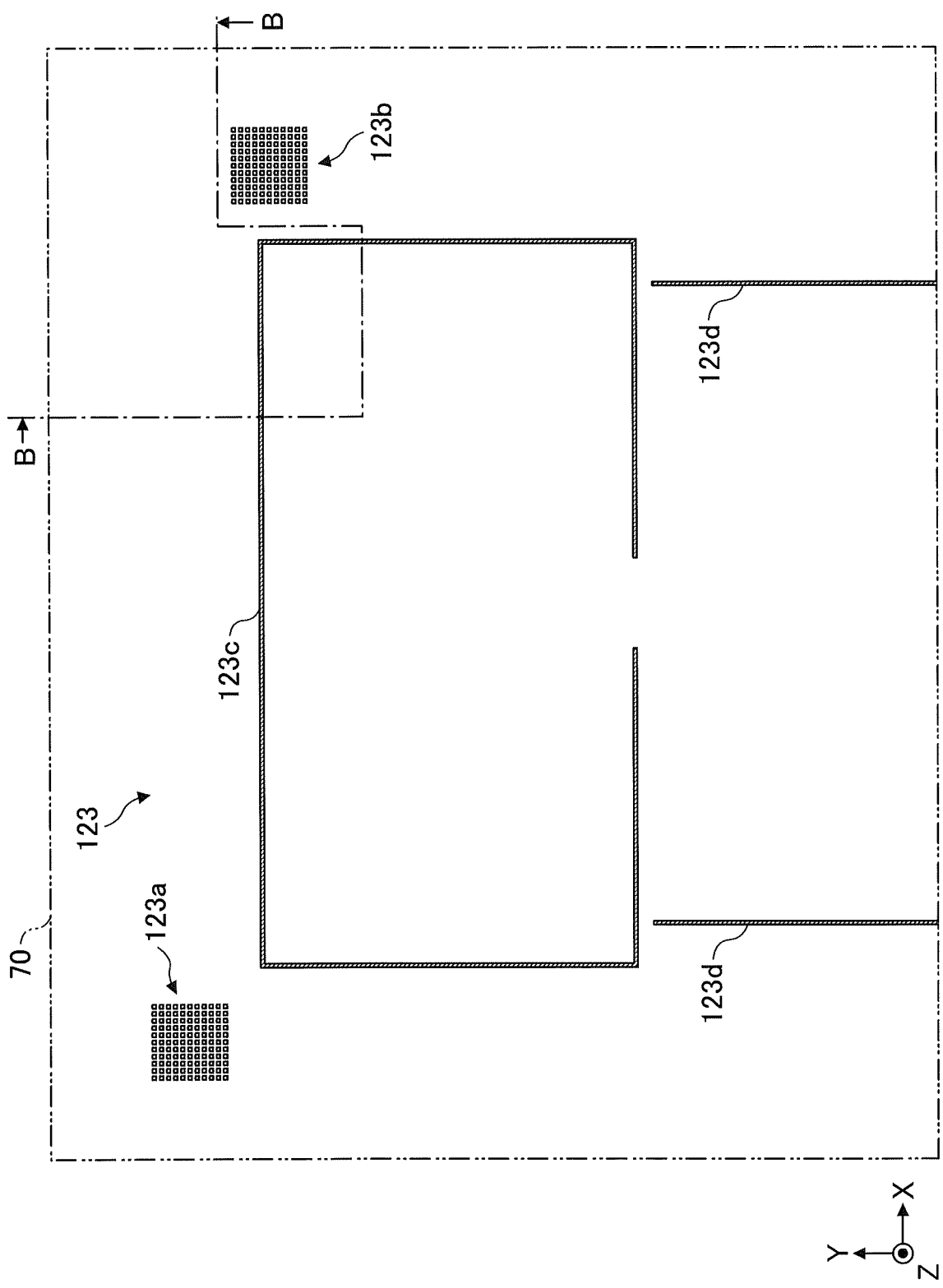
FIG. 17 is a plan view illustrating an example of a pattern of a second plug layer.
Figure 18:
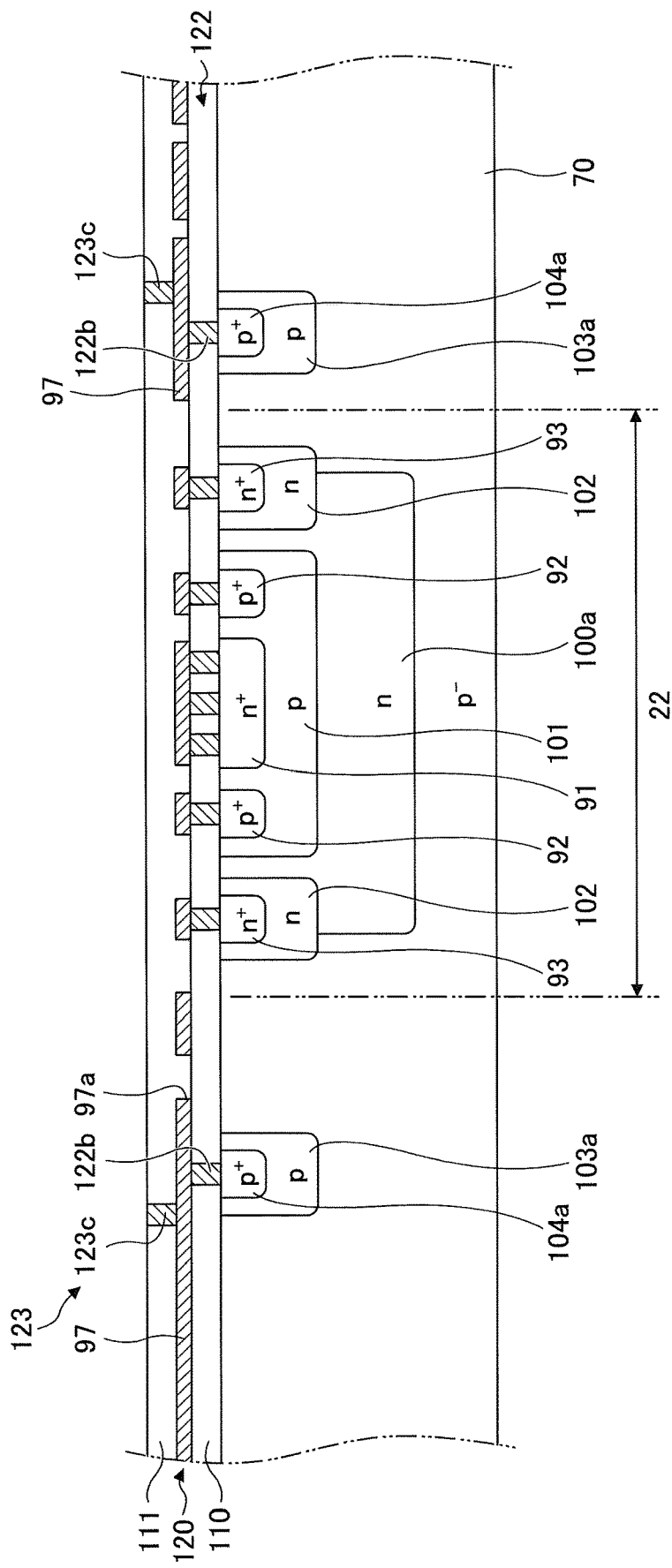
FIG. 18 is a schematic cross-sectional view along the B-B line in FIG. 17.

FIG. 17 is a plan view illustrating an example of a pattern of the second plug layer 123 formed on the first interconnect layer 120. FIG. 18 is a schematic cross-sectional view taken along the B-B line in FIG. 17.

As illustrated in FIG. 17, the second plug layer 123, as a coupling layer of interlayers, includes plug groups 123a and 123b, light-blocking walls 123c and 123d, and the like. Each of the plug groups 122a and 123a has a plurality of plugs that are arranged in a dot pattern. For example, each dot is square with each side being 0.6 µm. Each of the light-blocking walls 123c and 123d is formed by linearly arranged plugs. With respect to each of the light-blocking walls 123c and 123d, each plug is 0.6 µm in width, for example.

Each of the plug groups 123a and 123b, and the light-blocking walls 123c and 123d is formed by embedding a conductive material such as tungsten in openings (via holes), the openings being formed in a predetermined pattern on the second insulating film 111 that is provided on the first interconnect layer 120.

Figure 19:
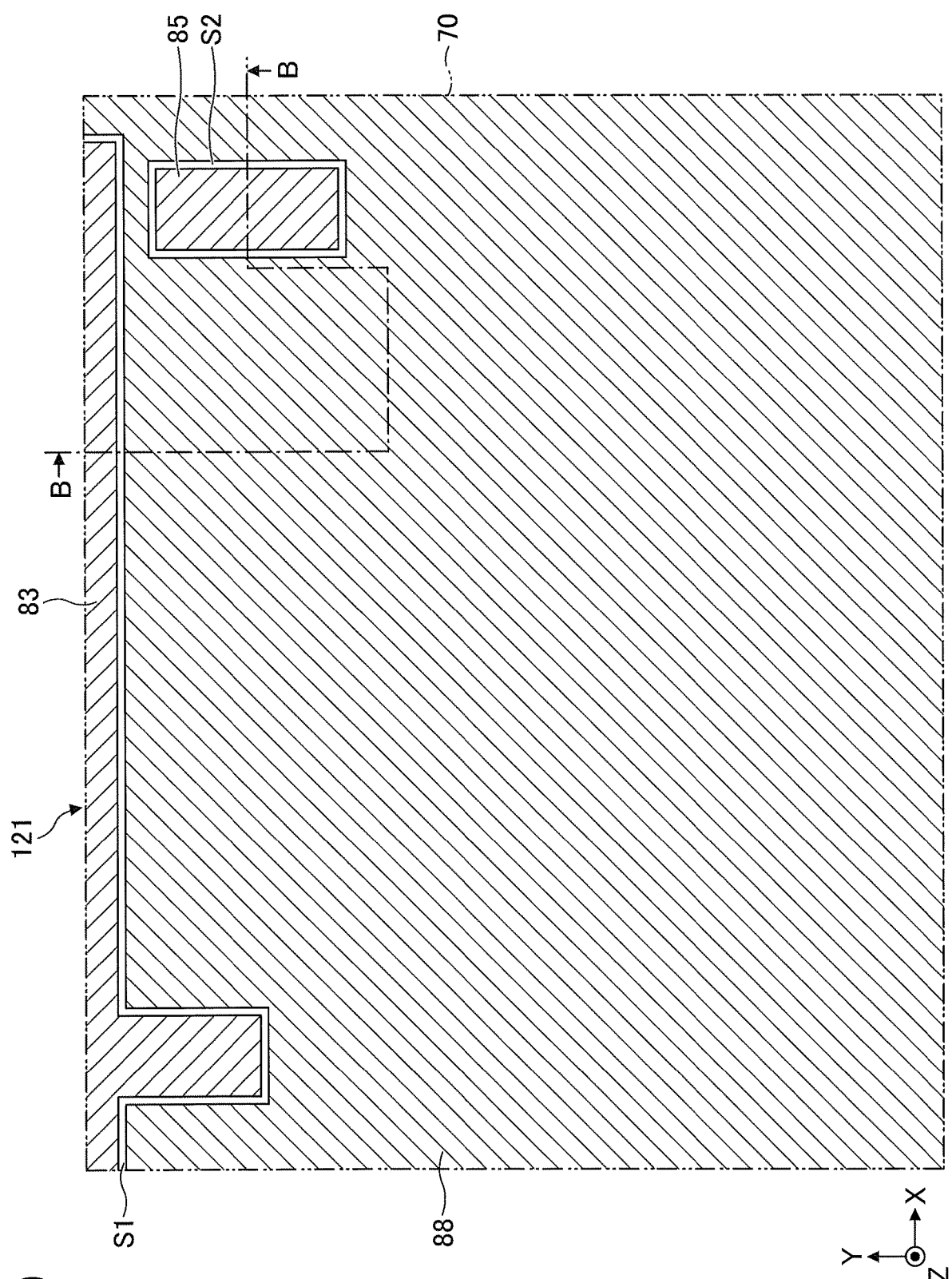
FIG. 19 is a plan view illustrating an example of a pattern of a second interconnect layer.
Figure 20:
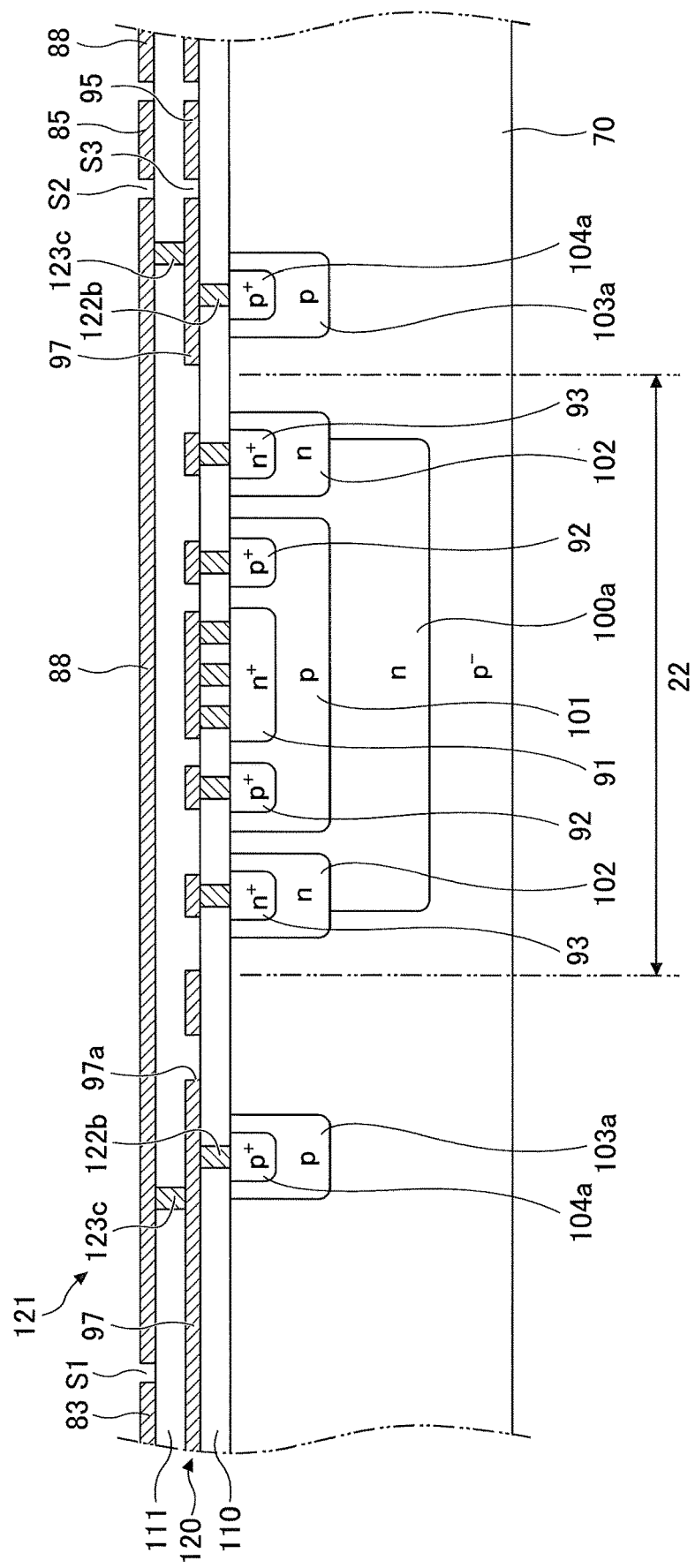
FIG. 20 is a schematic cross-sectional view taken along the B-B line in FIG. 19.

FIG. 19 is a plan view illustrating an example of a pattern of the second interconnect layer 121 formed on the second plug layer 123. FIG. 20 is a schematic cross-sectional view taken along the B-B line in FIG. 19.

As illustrated in FIG. 19, the second interconnect layer 121 includes the above lower electrode 83, the interconnect 85, the light-blocking film 88, and the like. The second interconnect layer 121 is formed by evaporating a conductive film, such as aluminum, on the second insulating film 111 as well as by patterning the conductive film with photolithography and etching. Slits are formed between the lower electrode 83 and the light-blocking film 88 as well as between the interconnect 85 and the light-blocking film 88, so as to electrically separate the interconnect and the film.

The lower electrode 83 is connected to an interconnect 96 via the plug group 123a. An interconnect 85 is connected to an interconnect 95 via the plug group 123b. As illustrated in FIG. 20, the light-blocking film 88 is connected to the conductive film 97 via the light-blocking walls 123c and 123d.

The above second insulating film 111 is formed on the second interconnect layer 121, and the moisture sensitive film 86 is formed on the second insulating film 111. The upper electrode 84 is formed on the moisture sensitive film 86, and the upper electrode 84 is connected to the interconnect 85. The overcoat film 87 is formed on the moisture sensitive film 86 to cover the upper electrode 84.

[Structure of Blocking Light to Temperature Detecting Unit]

Hereafter, a structure of blocking light to the temperature detecting unit 22 will be described.

The structure of blocking light to the temperature detecting unit 22 includes the light-blocking wall 122b (a first light-blocking wall) formed in the first plug layer 122 as a coupling layer to a substrate, the conductive film 97 formed in the first interconnect layer 120, the light-blocking wall 123c (a second light-blocking wall) formed in the second plug layer 123 used as a coupling layer of interlayers, and the light-blocking film 88 formed in the second interconnect layer 121.

The light-blocking wall 122b is formed on the p-type semiconductor substrate 70 so as to surround the temperature detecting unit 22. Specifically, the light-blocking wall 122b surrounds, in a plan view, the periphery of the temperature detecting unit 22, other than the interconnect 94 as a signal line drawn from the temperature detecting unit 22. A top end of the light-blocking wall 122b is also coupled around an opening 97a in the conductive film 97.

The light-blocking wall 123c is formed on the conductive film 97 so as to surround the temperature detecting unit 22. Specifically, the light-blocking wall 123c surrounds, in a plan view, the periphery of the temperature detecting unit 22, other than the interconnect 94 as a signal line drawn from the temperature detecting unit 22. The light-blocking wall 123c is formed to be positioned outside the light-blocking wall 122b, in a plan view. Note that the light-blocking wall 123c may be formed directly above the light-blocking wall 122b.

The light-blocking film 88 is connected to a top end of the light-blocking wall 123c, and is disposed over the temperature detecting unit 22 so as to cover an upper surface of the temperature detecting unit 22.

As described above, the temperature detecting unit 22 is protected from light by the light-blocking wall 122b, the light-blocking wall 123c, and the light-blocking film 88.

[Structure of Blocking Light to Signal Line]

Hereafter, a structure of blocking light to a signal line used in the temperature detecting unit 22 will be described.

The structure of blocking light to the interconnect 94 includes the light-blocking walls 122c and the light-blocking walls 123d.

Respective light-blocking walls 122c are disposed, in a plan view, along the Y direction on both sides of the interconnect 94 as a signal line, over the p-type semiconductor substrate 70. A top end of each light-blocking wall 122c is connected to the conductive film 97.

Respective light-blocking walls 123d are disposed along the Y direction on both sides of the interconnect 94, over the conductive film 97. Note that each light-blocking wall 123d is formed so as to be positioned outside the light-blocking wall 122c, in a plan view.

The light-blocking film 88 is connected to a top end of each light-blocking wall 123d, and overlies the interconnect 94.

In such a manner, the interconnect 94 is protected from light by the light-blocking walls 122c and the light-blocking walls 123d.

Note that the interconnect 94 is shaped, in a plan view, in a serpentine pattern outside the light-blocking wall 123c and the light-blocking wall 122b, in order to adjust a time constant of a signal by adding parasitic capacitance.

In FIGS. 13 and 17, the light-blocking wall 122c and the light-blocking walls 123d are separated from the light-blocking wall 122b and the light-blocking wall 123c, respectively, according to design rules. However, each light-blocking wall 122c may be connected to the light-blocking wall 122b, and each light-blocking wall 123d may be connected to the light-blocking wall 123c.

The above structure of blocking light to the signal line may be applicable to signal line(s) other than the interconnect 94.

[Determination Process of Malfunction]

Hereafter, a determination process of malfunction executed by the malfunction determining unit 34 will be described.

Figure 21:
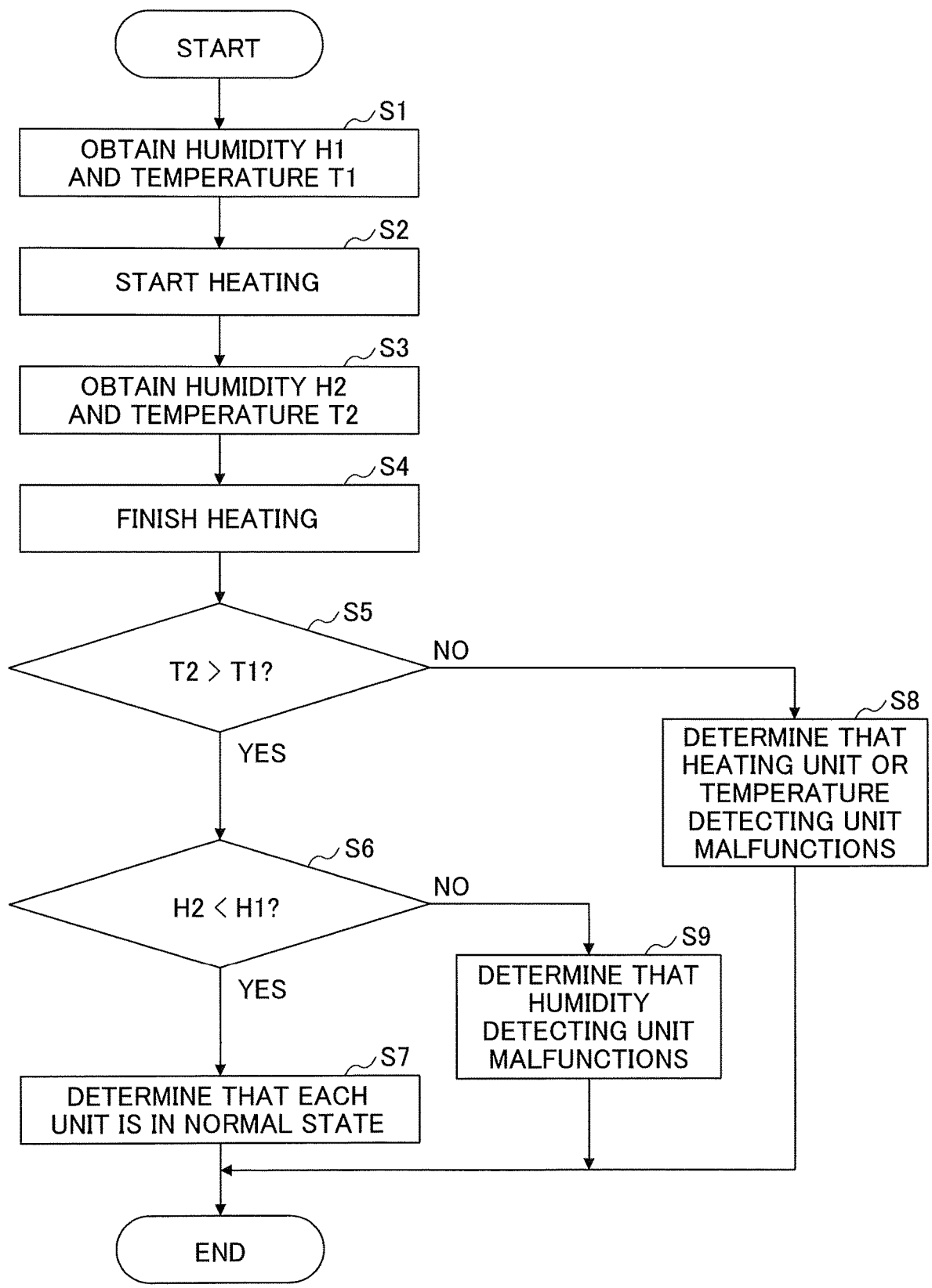
FIG. 21 is a flowchart for explaining an example of a determination process of malfunction.

FIG. 21 is a flowchart for explaining an example of a determination process of malfunction. For example, a determination process of malfunction starts in response to a start signal that is inputted to the ASIC chip 30 from outside the humidity detecting device 10.

As illustrated in FIG. 21, when the determination process of malfunction starts, the malfunction determining unit 34 acquires a measured value H1 of relative humidity (which is hereafter referred to as humidity H1) from the humidity-measurement processing unit 31, and acquires a measured value T1 of temperature (which is hereafter referred to as temperature T1) from the temperature-measurement processing unit 32 (step S1). Each of the humidity H1 and the temperature T1 is a measured value in an initial state where the heating unit 23 does not produce heat.

Next, the malfunction determining unit 34 transmits, to the heating control unit 33, an instruction to start heating to cause the heating unit 23 to start heating (step S2). After a certain period of time, the malfunction determining unit 34 further acquires a measured value H2 of relative humidity (which is hereafter referred to as humidity H2) from the humidity-measurement processing unit 31, and acquires a measured value T2 of temperature (which is hereafter is referred to as temperature T2) from the temperature-measurement processing unit 32 (step S3). The malfunction determining unit 34 then transmits an instruction to finish heating to the heating control unit 33 to cause the heating unit 23 to finish heating (step S4).

The malfunction determining unit 34 compares the temperature T1 with the temperature T2 (step S5), and proceeds to step S6 when T2>T1 is detected, i.e., when temperature is increased by heating (YES in step S5). In step S6, the malfunction determining unit 34 compares the humidity H1 with the humidity H2, and determines that each unit of the humidity detecting device 10 is in a normal state when H2<H1 is detected, i.e., when humidity is decreased by heating (YES in step S6) (step S7).

On the other hand, in step S5, when T2>T1 is not satisfied, i.e., when temperature is not increased by heating (NO in step S5), the malfunction determining unit 34 determines that the heating unit 23 or the temperature detecting unit 22 malfunctions (step S8). This is because the heating unit 23 is considered to be malfunctioning in heating operation, or alternatively, the temperature detecting unit 22 is considered to be malfunctioning in detection operation of temperature. A cause of the malfunction may include disconnection of first bonding wire(s) 43 or the like.

In step S6, when H2<H1 is not satisfied, i.e., when humidity is not decreased by heating (NO in step S6), the malfunction determining unit 34 determines that the humidity detecting unit 21 malfunctions (step S9). This is because the humidity detecting unit 21 is not functioning in detection operation of humidity even though the heating unit 23 normally functions in heating operation. A cause of the malfunction may include disconnection of first bonding wire(s) 43 or the like.

As a result, the determination process of malfunction is finished. Note that the malfunction determining unit 34 appropriately outputs results determined in step S7 to step S9 to the outside via the lead terminals 41.

For example, in a case of T1=23.0 degrees Celsius and H1=50% RH (relative humidity) in an initial state, a dew point is 12.03 degrees Celsius DP (dewpoint). When air temperature is increased by 2.0 degrees Celsius by heating from the heating unit 23, T2=25.0 degrees Celsius is detected in a normal state. In such a manner, when dew point temperature is maintained constantly at the dew point of 12.03 degrees Celsius DP, H2=44.3% RH is detected in a normal state.

As described above, in the determination process of malfunction, when temperature does not rise, or when temperature rises while humidity does not decrease, an anomaly is determined. With respect to such anomaly determination, a malfunction of the humidity detecting device 10 can be easily detected.

Effects of Embodiments

In the above embodiments, the heating unit 23 is formed by n-type diffusion layers 106, and a surface layer of the p-type semiconductor substrate 70 in which each n-type diffusion layer 106 is formed is flat. Thereby, with respect to the first to third insulating films 110 to 112 laminated on the p-type semiconductor substrate 70, as well as the humidity sensitive film 86, flatness is increased. In such a manner, the reference electrode 82, the lower electrode 83, and the upper electrode 84 formed over the heating unit 23 are not affected by the shape of the heating unit 23, and thus flatness of each electrode is improved. Accordingly, each of the distances between parallel-plate type electrodes formed over the heating unit 23 (a distance between the lower electrode 83 and the upper electrode 84 as well as a distance between the lower electrode 83 and the reference electrode 82) is approximately constant due to suppression of unevenness, and thus a decrease in accuracy of humidity detection is suppressed.

In the above embodiments, the first DAF 42 that is a resin film is disposed on the underside of the sensor chip 20. Such a resin film has low thermal conductivity, and has the effect of suppressing heat radiation from the sensor chip 20 to the ASIC chip 30. Thereby, thermal conductivity from the heating unit 23 to the humidity sensitive film 86 is increased.

In the above embodiments, n-type diffusion layers 106 that constitute the heating unit 23 are formed in a one-dimensional grating pattern, and thus produced heat is uniformly conducted. In contrast, if one region is formed by an n-type diffusion layer 106, a current flow is concentrated to a region having high electrical conductivity due to an uneven addition of impurities, etc. In such a manner, heat might be produced unevenly.

In the above embodiments, the temperature detecting unit 22 and the humidity detecting unit 21 are disposed so as to be exposed to the opening 50. In this case, light incident from the opening 50 is propagated through the transmissive overcoat film 87 and the moisture sensitive film 86. This propagated light may enter the second interconnect layer 121, from the slit S1 between the light-blocking film 88 and the lower electrode 83 or/and the slit S2 between the light-blocking film 88 and the interconnect 85 (see FIGS. 19 and 20). Further, light incident on the second interconnect layer 121 may enter the first interconnect layer 120 from the slit S3 (see FIGS. 15 and 20) between the conductive film 97 and the interconnect 95.

If light enters a temperature detecting unit 22, unwanted charge might be caused by the photoelectric effect. In this case, electrical fluctuations changes, and thus accuracy of temperature detection might be decreased.

In the above embodiments, as described above, a structure of blocking light to the temperature detecting unit 22 is configured by the first plug layer 122, the first interconnect layer 120, the second plug layer 123, and the second interconnect layer 121. In such a manner, it is possible to block light entering from the slits S1 to S3, etc., which might become a pathway of light, thereby preventing a process of photoelectric conversion. Accordingly, accuracy of temperature detection provided by the temperature detecting unit 22 is improved.

[Modifications]

Hereafter, various modifications will be described.

In the above embodiments, the reference electrode 82 is positioned over the heating unit 23, but may not necessarily be over the heating unit 23.

In the above embodiments, the p-type semiconductor substrate 70 is used as a semiconductor substrate that is used in the sensor chip 20, but an n-type semiconductor substrate can be used. In this case, the heating unit 23 may be formed by p-type diffusion layer(s). In other words, a heating unit may be formed by impurity diffusion layer(s) in which the surface layer of the semiconductor substrate is doped with an impurity.

In the above embodiments, the temperature detecting unit 22 is configured by one or more npn-type bipolar transistors 90, but may be configured by one or more pnp-type bipolar transistors. Further, instead of one or more bipolar transistor, the temperature detecting unit 22 may be configured by one or more p-n junction diodes.

The temperature detecting unit 22 may be a temperature sensor with a p-n junction, other than the band-gap type. For example, the temperature detecting unit 22 may be a resistance-type temperature sensor that detects temperature based on a temperature dependence of a resistance value, when an impurity diffusion layer (n-type or p-type diffusion layer) is used as a resistor.

In the above embodiments, interconnect layers over a semiconductor substrate include two layers that are the first interconnect layer 120 and the second interconnect layer 121. However, such interconnect layers may include three or more layers. In this case, a light-blocking film is formed by a top interconnect layer among a plurality of interconnect layers. Also, in this case, a first light-blocking wall is formed by a coupling layer to a substrate, which couples a lowest interconnect layer among a plurality of interconnect layers to a semiconductor substrate and, further, second-blocking walls are formed by respective coupling layers of interlayers. In such a manner, when there are a plurality of second light-blocking walls, a second light-blocking wall may be preferably located further to the exterior in accordance with being positioned on an upper side. However, a plurality of second light-blocking walls may be arranged in a same position in an XY plane, in a plan view.

Further, a light-blocking film is not limited to a top interconnect layer. For example, a light-blocking film may be formed by an upper interconnect layer over second light-blocking walls. A coupling layer to a substrate is not limited to a lowest interconnect layer. For example, other than a lowest interconnect layer, a coupling layer to a substrate may be formed by at least one given interconnect layer from among a plurality of interconnect layers.

The polysilicon described above may be formed as an n-type or a p-type by a semiconductor manufacturing process. For example, when the gate electrode 74 illustrated in FIG. 6 is formed of polycrystalline silicon, resistor(s) can be simultaneously formed in a same layer as the gate electrode 74, by changing an impurity concentration or/and an impurity. Further, the bridge circuit below can be formed by a combination of resistor(s) formed of polycrystalline silicon and resistor(s) formed by implantation for diffusion.

Figure 22:
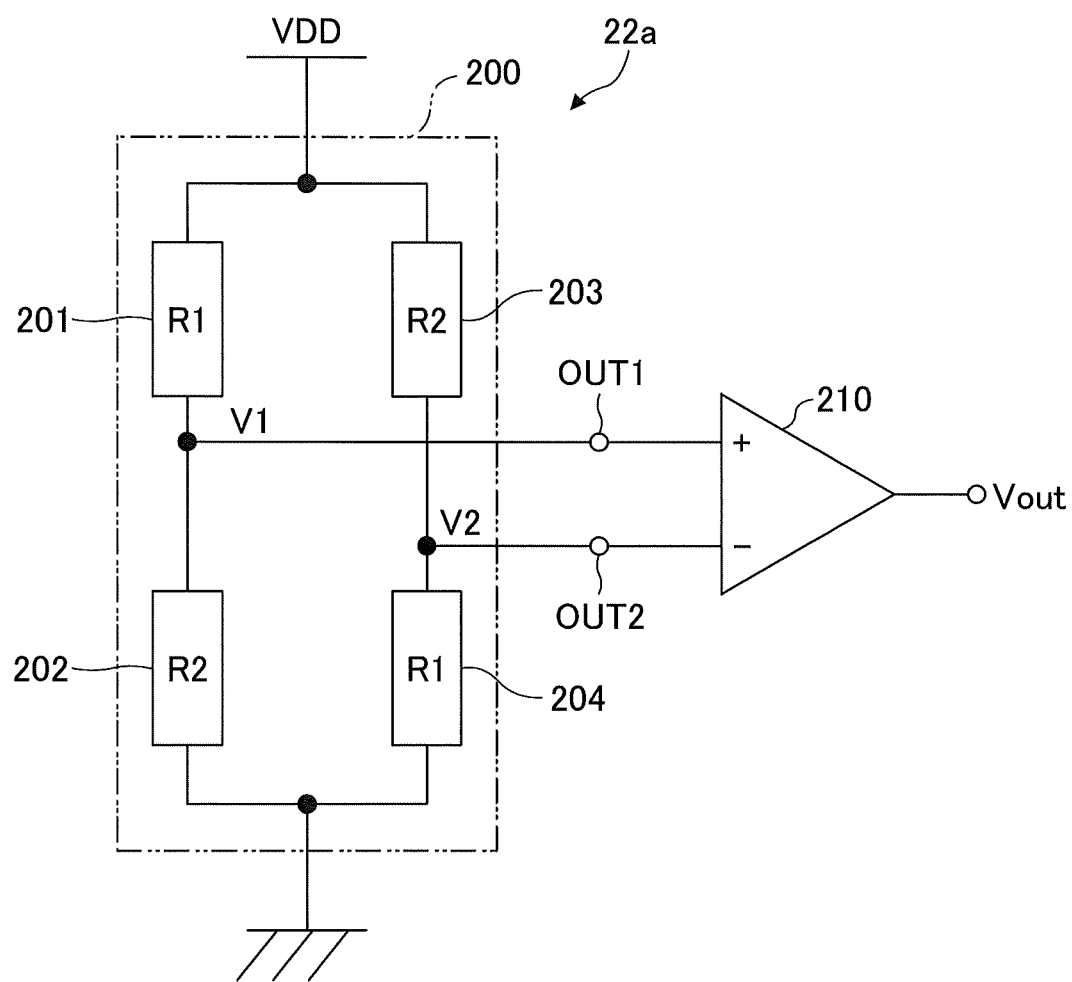
FIG. 22 is a diagram illustrating an example of a resistance-type temperature sensor that is used as the temperature detecting unit.

FIG. 22 is a diagram illustrating an example of a resistance-type temperature sensor that is used as a temperature detecting unit. As illustrated in FIG. 22, a temperature detecting unit 22a includes a bridge circuit 200 with two branches across which a differential amplifier 210 is connected, the two branches having a first resistor 201, a second resistor 202, a third resistor 203, and a fourth resistor 204.

The first resistor 201 and the second resistor 202 are connected in series between a power supply potential (VDD) and a ground potential. Similarly, the third resistor 203 and the fourth resistor 204 are connected in series between the power supply potential and the ground potential.

Each of the first to fourth resistors 201 to 204 is a resistor that is formed by an n-type or p-type diffusion layer on a surface layer of a semiconductor substrate, or a resistor that is formed of polysilicon. The first to fourth resistors 201 to 204 is used as a combination of resistors formed by impurity diffusion of silicon. In this case, as in the case where a temperature detecting unit 22 is configured by diodes, if light enters a temperature detecting unit 22, accuracy of temperature detection might be decreased due to the photoelectric effect. With respect to a resistance-type temperature sensor as well, a process of photoelectric conversion is preferably prevented by blocking light in a same manner as the above embodiments.

The first resistor 201 and the fourth resistor 204 have a same impurity concentration approximately, as well as having a same temperature coefficient approximately. The second resistor 202 and the third resistor 203 have a same impurity concentration approximately, as well as having a same temperature coefficient approximately.

A potential V1 at a connection point between the first resistor 201 and the second resistor 202 is inputted to the differential amplifier 210 via an external terminal OUT1. A potential V2 at a connection point between the third resistor 203 and the fourth resistor 204 is inputted to the differential amplifier 210 via an external terminal OUT2. The external terminals OUT1 and OUT2 are formed by respective pads 24, instead of the aforementioned terminal for temperature detection.

For example, the differential amplifier 210 is provided in the ASIC chip 30. The differential amplifier 210 amplifies a difference between the potential V1 and the potential V2 to output a differential output Vout. When a resistance value of each of the first resistor 201 and the fourth resistor 204 is set as R1, and further, a resistance value of each of the second resistor 202 and the third resistor 203 is set as R2, a differential output value Vout is expressed by Equation (1) below.

$$Vout=[(R1-R2)/(R1+R2)] \times VDD \quad (1)$$

Since a change in the resistance value R1 in accordance with temperature is different from that in the resistance value R2, temperature can be determined based on the differential output Vout. Note that in Equation (1), since a differential output Vout depends on the power supply potential VDD, it is preferable to determine temperature based on a value obtained through Vout/VDD indicating a differential output Vout divided by a power supply potential VDD.

In the above embodiments, the humidity detecting device 10 has a stack structure in which the sensor chip 20 and the ASIC chip 30 are stacked. However, the humidity detecting device 10 is applicable to a humidity detecting devices other than such a stack structure.

In the above embodiments, an ESD protection circuit 60 is configured by an NMOS transistor, but can be configured by a PMOS transistor. A process of forming a gate electrode of each MOS transistor that constitutes an ESD protection circuit 60 may be shared with a process of forming interconnect layers used in a humidity detecting unit 21 or/and a temperature detecting unit 22. Thereby, a process of manufacturing a sensor chip 20 can be simplified. Further, an ESD protection circuit 60 may be configured by a p-n junction in a semiconductor substrate. In this case, a gate electrode is not required, thereby simplifying a process of manufacturing a sensor chip 20.

In the above embodiments, the malfunction determining unit 34 is provided in the ASIC chip 30. However, the malfunction determining unit 34 may be provided outside the ASIC chip 30, e.g., in an external device (e.g., a microcomputer) of the humidity detecting device 10.

In the present disclosure, with respect to the term "cover" or "on" that involves a positional relationship between given two elements, such a term means both cases where a first element is disposed on a surface of a second element indirectly via other element(s) and where a first element is disposed on a surface of a second element directly.

Explanation has been provided above for the present disclosure in relation to one or more embodiments. However, the present disclosure is not limited to the embodiments as described, and changes or alternatives can be made within the spirit of the present disclosure.

What is claimed is:

1. A humidity detecting device comprising;
    a semiconductor substrate including at least one impurity diffusion layer;
    a heating unit formed by the at least one impurity diffusion layer; and
    a humidity detecting unit including:
        a plurality of insulating films laminated on the semiconductor substrate;
        a reference electrode disposed over the heating unit, the reference electrode being formed from a first insulating film among the insulating films;
        a lower electrode disposed over the reference electrode, the lower electrode being formed from a second insulating film among the insulating films;
        a humidity sensitive film disposed on a third insulating film among the insulating films, so as to cover the lower electrode; and
        an upper electrode disposed on the humidity sensitive film,
    wherein the lower electrode and the upper electrode constitute a parallel plate humidity capacitor, and the lower electrode and the reference electrode constitute a parallel plate reference capacitor, and
    wherein the humidity capacitor and the reference capacitor are disposed over the heater unit.

2. The humidity detecting device according to claim 1, wherein the at least one impurity diffusion layer is a plurality of impurity diffusion layers, and
    wherein the plurality of impurity diffusion layers are arranged in a one-dimensional grating pattern.

3. The humidity detecting device according to claim 1, further comprising a temperature detecting unit disposed in the semiconductor substrate.

4. The humidity detecting device according to claim 3, wherein the temperature detecting unit is a band-gap type temperature detecting unit, and includes one or more bipolar transistors at each of which a base is electrically connected to a collector.

5. The humidity detecting device according to claim 3, wherein the temperature detecting unit is a band-gap type temperature detecting unit, and includes one or more p-n junction diodes.

6. The humidity detecting device according to claim 3, wherein the temperature detecting unit is a resistance-type temperature sensor configured to detect temperature based on a temperature dependence of at least one resistor, an n-type diffusion layer or a p-type diffusion layer included in the semiconductor substrate being used as the at least one resistor.

7. The humidity detecting device according to claim 6, wherein the at least one resistor is a plurality of resistors having different impurity concentrations, and
wherein the temperature detecting unit includes a bridge circuit in which the plurality of resistors are electrically connected.

8. The humidity detecting device according to claim 3, wherein the temperature detecting unit includes an n-type diffusion layer and a p-type diffusion layer, and
wherein the impurity diffusion layer has a same depth from a surface of the semiconductor substrate as the n-type diffusion layer or the p-type diffusion layer.

9. The humidity detecting device according to claim 1, wherein the semiconductor substrate is a p-type semiconductor substrate, and wherein the impurity diffusion layer is an n-type diffusion layer.

10. The humidity detecting device according to claim 1, wherein the humidity sensitive film is formed of polyimide.

11. The humidity detecting device according to claim 1, further comprising a malfunction determining unit configured to determine whether the humidity detecting device malfunctions based on humidity and temperature, the humidity being detected based on capacitance between the lower electrode and the upper electrode, and the temperature being detected by the temperature detecting unit.

12. The humidity detecting device according to claim 11, wherein the malfunction determining unit is configured to determine that the humidity detecting device malfunctions upon detecting the temperature not being increased, or detecting increased temperature with humidity not being decreased, when causing the heating unit to produce heat.

13. The humidity detecting device according to claim 1, further comprising a temperature detecting unit disposed in the semiconductor substrate;
a plurality of interconnect layers disposed on respective given insulating films among the plurality of insulating films;
a first via electrically coupling a given interconnect layer among the plurality of interconnect layers to the semiconductor substrate;
at least one second via electrically coupling adjacent interconnect layers among the plurality of interconnect layers;
a first light-blocking wall provided in the first via so as to surround the temperature detecting unit in a plan view;
at least one second light-blocking wall provided in the at least one second via so as to surround the temperature detecting unit in a plan view; and
a light-blocking film provided in a given interconnect layer over the second light-blocking wall, among the plurality of interconnect layers, so as to cover an upper surface of the temperature detecting unit.

14. The humidity detecting device according to claim 13, further comprising a sealing member sealing the humidity detecting device such that each of the humidity detecting unit and the temperature detecting unit is partially exposed.

15. The humidity detecting device according to claim 14, wherein the humidity detecting unit and the temperature detecting unit are integrated as a sensor chip.

16. The humidity detecting device according to claim 15, wherein the sensor chip includes a ground electrode terminal, and wherein each of the first light-blocking wall, the second light-blocking wall and the light-blocking film is electrically connected to the ground electrode terminal.

17. The humidity detecting device according to claim 16, wherein the temperature detecting unit is electrically connected to a signal line, and
wherein each of the first light-blocking wall and the second light-blocking wall surrounds, in a plan view, a region excluding the signal line drawn from the temperature detecting unit, in the surroundings of the temperature detecting unit.

18. The humidity detecting device according to claim 13, wherein the second light-blocking wall is disposed outside the first light-blocking wall, in a plan view.

19. A method of determining malfunction of a humidity detecting device, the humidity detecting device including
a semiconductor substrate including a impurity diffusion layer,
a heating unit formed by the impurity diffusion layer,
a plurality of insulating films laminated on the semiconductor substrate,
a reference electrode disposed over the heating unit, the reference electrode being formed from a first insulating film among the insulating films,
a lower electrode disposed over the reference electrode, the lower electrode being formed from a second insulating film among the insulating films,
a humidity sensitive film disposed on a third insulating film among the insulating films, so as to cover the lower electrode,
an upper electrode disposed on the humidity sensitive film, and
a temperature detecting unit disposed in the semiconductor substrate, wherein the lower electrode and the upper electrode constitute a parallel plate humidity capacitor, and the lower electrode and the reference electrode constitute a parallel plate reference capacitor, and
wherein the humidity capacitor and the reference capacitor are disposed over the heater unit, the method comprising:
detecting humidity based on capacitance of the humidity capacitor that constitutes the lower electrode and the upper electrode;
detecting temperature by the temperature detecting unit; and
determining whether the humidity detecting device malfunctions based on the humidity and the temperature.

20. The method according to claim 19, wherein the determining includes determining that the device malfunctions, upon detecting the temperature not being increased, or detecting increased temperature with the humidity not being decreased, when the heating unit heats up.

* * * * *